(12) United States Patent
Kim

(10) Patent No.: US 11,467,770 B2
(45) Date of Patent: Oct. 11, 2022

(54) MEMORY CONTROLLER, MEMORY DEVICE, AND MEMORY SYSTEM

(71) Applicant: SK hynix Inc., Gyeonggi-do (KR)

(72) Inventor: Dong Hyun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 275 days.

(21) Appl. No.: 16/790,171

(22) Filed: Feb. 13, 2020

(65) Prior Publication Data

US 2021/0019086 A1    Jan. 21, 2021

(30) Foreign Application Priority Data

Jul. 17, 2019 (KR) .................. 10-2019-0086615

(51) Int. Cl.
*G06F 3/06* (2006.01)
*G11C 16/30* (2006.01)
*G11C 16/04* (2006.01)

(52) U.S. Cl.
CPC .......... *G06F 3/0659* (2013.01); *G06F 3/0604* (2013.01); *G06F 3/0679* (2013.01); *G11C 16/30* (2013.01); *G11C 16/0483* (2013.01)

(58) Field of Classification Search
CPC .... G06F 3/0659; G06F 3/0604; G06F 3/0679; G11C 16/30; G11C 16/0483

USPC ......................................... 713/300; 711/103
See application file for complete search history.

(56) References Cited

U.S. PATENT DOCUMENTS

| | | | | |
|---|---|---|---|---|
| 5,864,310 | A | * | 1/1999 | Khorramabadi .... H03M 1/1019 341/118 |
| 9,792,964 | B1 | * | 10/2017 | Okuma ............ G11C 29/12005 |
| 2012/0133800 | A1 | * | 5/2012 | Jung ...................... H04N 5/378 348/241 |
| 2017/0093400 | A1 | * | 3/2017 | Bains .................... G06F 3/0673 |
| 2017/0194917 | A1 | * | 7/2017 | Tanabe .................... H03M 1/38 |
| 2020/0075069 | A1 | * | 3/2020 | Kim ....................... G11C 5/04 |

FOREIGN PATENT DOCUMENTS

| KR | 10-0763845 | 10/2007 |
|---|---|---|
| KR | 10-2017-0112272 | 10/2017 |

* cited by examiner

*Primary Examiner* — Gautam Sain
(74) *Attorney, Agent, or Firm* — IP & T Group LLP

(57) ABSTRACT

A memory system may include a memory device and a memory controller. The memory device may include input/output pads. The memory controller may control an operation of the memory device through the input/output pads. The memory controller may generate an offset adjustment command and transmit the offset adjustment command to the memory device. The memory device may store an offset of a signal received to the input/output pads, in response to the offset adjustment command.

20 Claims, 14 Drawing Sheets

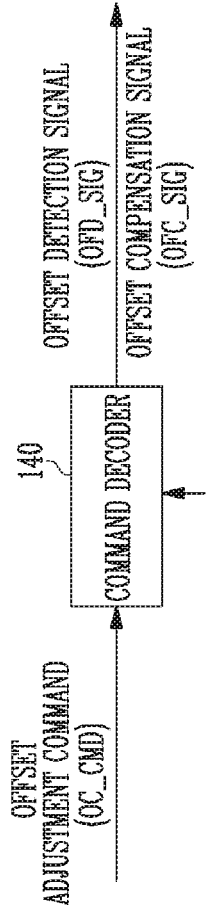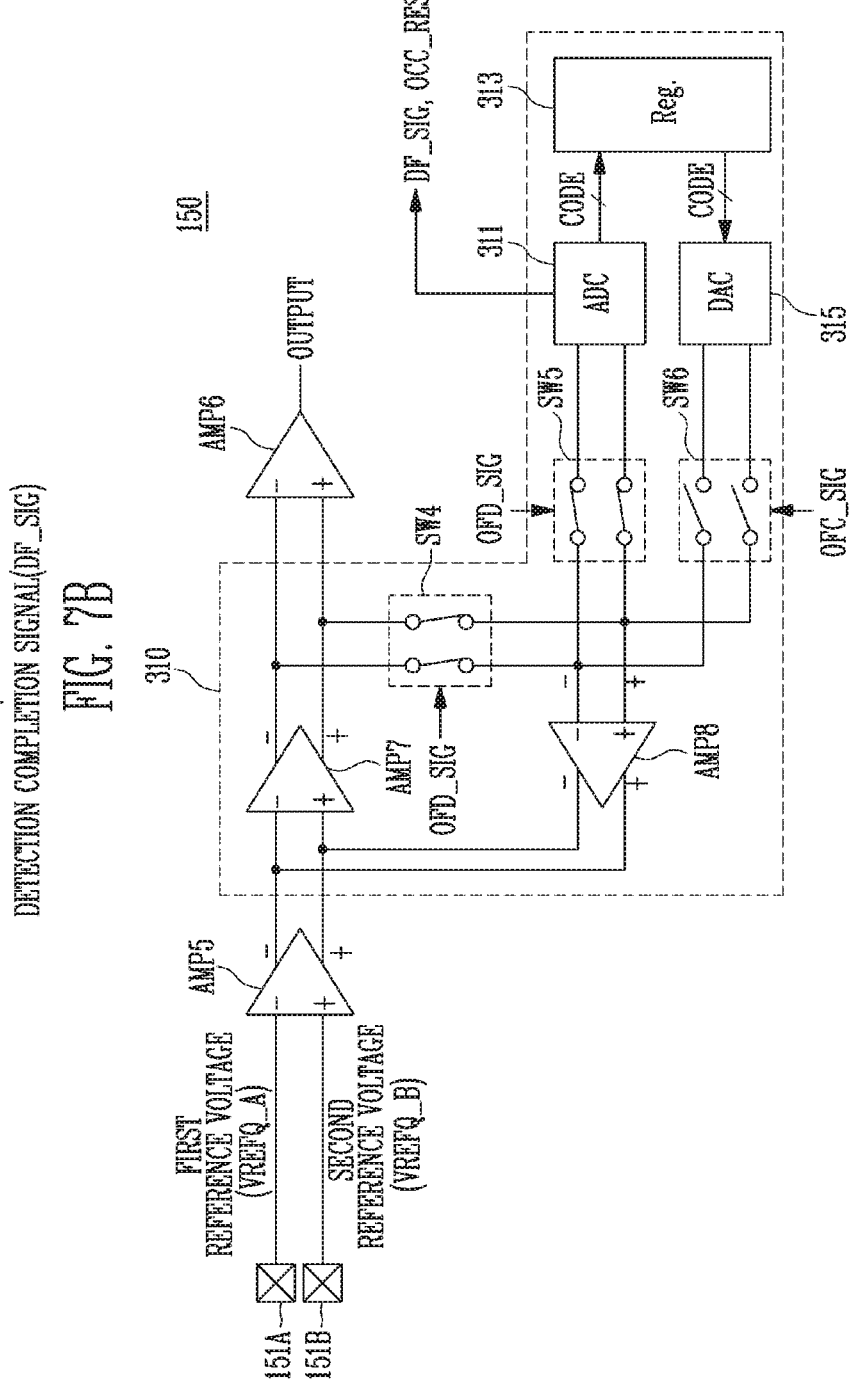

MEMORY CONTROLLER, MEMORY DEVICE, AND MEMORY SYSTEM

CROSS-REFERENCE TO RELATED APPLICATION

The present application claims priority under 35 U.S.C. § 119(a) to Korean patent application number 10-2019-0086615, filed on Jul. 17, 2019, which is incorporated herein by reference in its entirety.

BACKGROUND

1. Field of Invention

Various embodiments of the present disclosure generally relate to an electronic device, and more particularly, to a memory controller, a memory device, a memory system, and an operating method thereof.

2. Description of Related Art

A memory system stores data under control of a host device such as a computer, a smartphone, or a smartpad. Different types of devices in the memory system may be used to store data. For example, a memory system may employ a hard disk drive (HDD) which stores data in a magnetic disk, or a solid state drive (SSD) or a memory card which stores data in a semiconductor memory, particularly, a nonvolatile memory.

In addition to a memory device, the memory system may also include a memory controller configured to store data in the memory device. The memory device may be volatile or nonvolatile. Representative examples of a nonvolatile memory device include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM).

SUMMARY

Various embodiments of the present disclosure are directed to a memory system, a memory controller, and a memory device capable of removing a direct current component offset from an input signal, and an operating method thereof.

A memory system in accordance with an embodiment of the present disclosure may include a memory device and a memory controller. The memory device may include input/output pads. The memory controller may control an operation of the memory device through the input/output pads. The memory controller may generate an offset adjustment command and transmit the offset adjustment command to the memory device. The memory device may store an offset of a signal received to the input/output pads, in response to the offset adjustment command.

In an embodiment, the memory controller for controlling an operation of the memory device may include first and second pads, an output signal determiner, a switch, and a control signal generator. The first and second pads may be coupled with the memory device. The output signal determiner may output, to the memory device, an offset adjustment command for controlling the memory device to perform an offset adjustment operation through the first and the second pads. The switch may control electrical connection between a first node and a second node that are respectively coupled to the first pad and the second pad to each other. The control signal generator may control the operation of the switch and the output signal determiner.

In an embodiment, the memory device coupled with the memory controller through the input/output pad may include a command decoder and an offset controller. The command decoder may generate an offset detection signal or an offset compensation signal based on whether an offset adjustment command has been received from the memory controller. The offset controller may perform an offset detection operation of the input/output pad based on the offset detection signal, and perform an offset compensation operation of the input/output pad based on the offset compensation signal.

A method of operating a memory controller for controlling a memory device in accordance with an embodiment of the present disclosure may include: outputting an offset removing command to the memory device through a second pad, the offset removing command instructing to store a direct current (DC) component signal of a signal received from the memory device through an input/output pad including a first pad and the second pad that are coupled to the memory device; and generating a switching control signal for controlling connection of the first pad and the second pad after the offset removal command has been output.

An embodiment of the present disclosure may provide a method of operating a DC component removal circuit. The DC component removal circuit may include a signal receiver configured to receive a signal input through a first pad and a second pad; a first converter configured to convert the signal input through the first pad and the second pad to a digital code; a first switch configured to control connection between the signal receiver and the first converter; a register configured to store an output of the first converter; a second converter configured to convert the output of the register to an analog signal; and a second switch configured to control connection of the second converter and the signal receiver. The method may include: receiving an offset removal command for instructing to remove an offset of a signal input through a third pad and a fourth pad; generating an offset detection signal and an offset compensation signal by decoding the offset removal command; and connecting, by the first switch, the first converter and the signal receiver in response to the offset detection signal, and disconnecting, by the second switch, the second converter and the signal receiver in response to the offset compensation signal.

BRIEF DESCRIPTION OF THE DRAWINGS

FIG. 7A is a diagram illustrating an operation of a command decoder included in a memory device in accordance with an embodiment of the present disclosure.

FIG. 7B is a block diagram illustrating an offset controller included in a memory device in accordance with an embodiment of the present disclosure.

DETAILED DESCRIPTION

Figure 1:
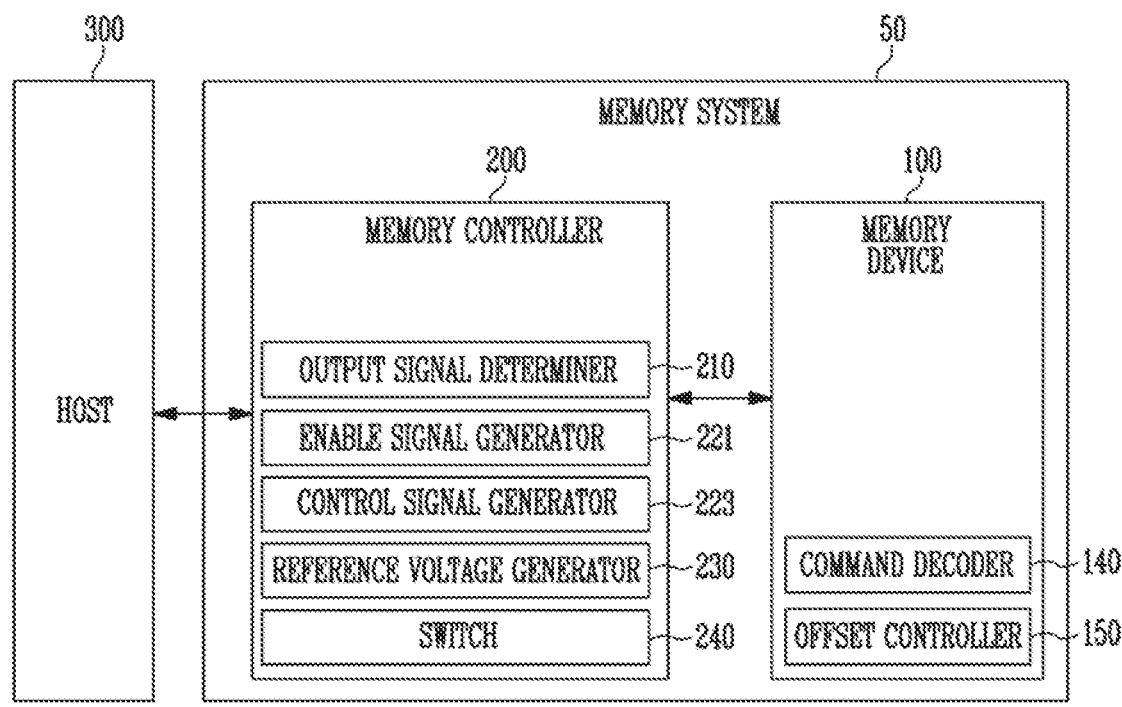
FIG. 1 is a block diagram illustrating a memory system.

Specific structural and functional description provided herein are directed to embodiments of the present disclosure. However, the present invention is not limited to the disclosed embodiments or to any specific structural or functional detail provided.

Rather, the present invention encompasses all modifications, equivalents and alternatives of any of the disclosed embodiments that fall within the spirit and scope of the present disclosure.

It will be understood that, although the terms "first", "second", etc. may be used herein to identify various elements, these elements should not be limited by these terms. These terms are only used to distinguish one element from another element that otherwise have the same or similar names. A first element in one instance could be termed a second element in another instance without indicating any structural or functional change in the element itself.

It will be understood that when an element is referred to as being "coupled" or "connected" to another element, it can be directly coupled or connected to the other element or one or more intervening elements may be present therebetween. In contrast, it should be understood that when an element is referred to as being "directly coupled" or "directly connected" to another element, there are no intervening elements present.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations thereof but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and not be interpreted in an idealized or overly formal sense unless expressly so defined herein.

Detailed description of functions and structures well known to those skilled in the art may be omitted to avoid obscuring the subject matter of the present disclosure. This aims to make the subject matter of the present disclosure clear.

Various embodiments of the present disclosure are be described more fully below with reference to the accompanying drawings, in which preferred embodiments of the present disclosure are shown, so that those of ordinary skill in the art can easily carry out and practice the present invention.

FIG. 1 is a block diagram illustrating a memory system 50.

Referring to FIG. 1, the memory system 50 may include a memory device 100 and a memory controller 200.

The memory system 50 may be configured to store data under control of a host 300 such as a cellular phone, a smartphone, an MP3 player, a laptop computer, a desktop computer, a game machine, a TV, a tablet PC, or an in-vehicle infotainment system.

The memory system 50 may be configured as any of various kinds of storage devices depending on a host interface, which is a communication system for communicating with the host 300. For example, the memory system 50 may be configured as an SSD, MMC, eMMC, RS-MMC, or micro-MMC type multimedia card, an SD, mini-SD, micro-SD type secure digital card, a universal serial bus (USB) memory system, a universal flash storage (UFS) device, a personal computer memory card international association (PCMCIA) card type memory system, a peripheral component interconnection (PCI) card type memory system, a PCI-express (PCI-E) type memory system, a compact flash (CF) card, a smart media card, and/or a memory stick.

The memory system 50 may be manufactured in the form of any of various package types. For instance, the memory system 50 may be manufactured as a package on package (POP) type, a system in package (SIP) type, a system on chip (SOC) type, a multi-chip package (MCP) type, a chip on board (COB) type, a wafer-level fabricated package (WFP) type, and/or a wafer-level stack package (WSP) type.

The memory controller 200 may control overall operation of the memory system 50.

When power is supplied to the memory system 50, the memory controller 200 may execute firmware (FW). In the case where the memory device 100 is a flash memory device, the memory controller 200 may execute firmware such as a flash translation layer (FTL) for controlling communication between the host 300 and the memory device 100.

The memory controller 200 may include an output signal determiner 210. The output signal determiner 210 may receive an operation request OPR_REQ from the host 300. The operation request OPR_REQ may be any of an offset adjustment request, a program (write) request, a read request, and an erase request. The output signal determiner 210 may receive various types of data and various requests including an operation request OPR_REQ from the host 300. The output signal determiner 210 may generate and output a command corresponding to a request, e.g., an OPR_REQ, received from the host 300. Alternatively, the output signal determiner 210 may output data received from the host 300.

In an embodiment, the output signal determiner 210 may generate and output a command based on the operation request OPR_REQ generated in the memory controller 200. The operation request OPR_REQ generated from the memory controller 200 may be a garbage collection request or a wear-leveling request. The operation request OPR_REQ generated from the memory controller 200 may include various requests including the above-stated requests.

The memory controller may include an enable signal generator 221. The enable signal generator 221 may generate a command enable signal CMD_EN for controlling the output signal determiner 210. The command enable signal CMD_EN may control the memory controller 200 to output a command to the memory device 100. The enable signal generator 221 may output a command enable signal CMD_EN having an enabled state for controlling the memory controller 200 to output a command to the memory device 100. The command enable signal CMD_EN having an enabled state may control the output signal determiner 210 to generate a command corresponding to a request received from the host 300 or generate or output a command corresponding to an internal operation request OPR_REQ of the memory controller 200.

The enable signal generator 221 may output a command enable signal CMD_EN having a disabled state for controlling the memory controller 200 not to output a command to the memory device 100. The command enable signal CMD_EN having the disabled state may control the output signal determiner 210 not to output a command corresponding to a request. The request may be an operation request OPR_REQ received from the host 300 or an internal operation request OPR_REQ of the memory controller 200.

The memory controller may include a control signal generator 223. The control signal generator 223 may control a switch 240.

Figure 5:
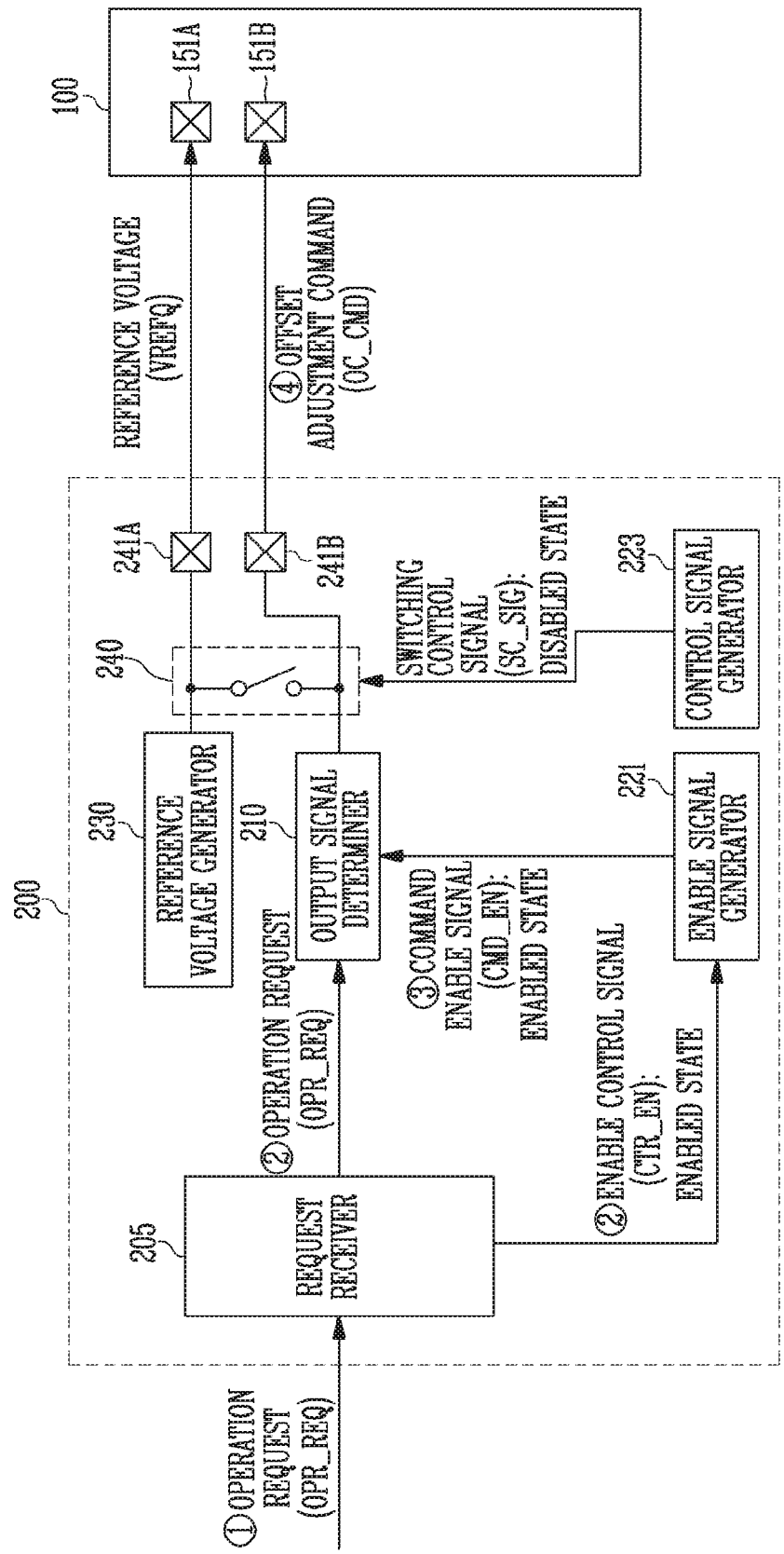
FIG. 5 is a diagram illustrating a method of outputting an offset adjustment command to the memory device of FIG. 1 in accordance with an embodiment.

In detail, the control signal generator 223 may generate and output a switching control signal SC_SIG for controlling the memory controller 200 to connect or disconnect first and second pads 241A and 241B included in an input/output pad, as shown in FIG. 5.

The control signal generator 223 may generate a switching control signal SC_SIG having an enabled state and output the switching control signal SC_SIG to the switch 240. The switching control signal SC_SIG having the enabled state may control the switch 240 to connect the first and second pads 241A and 241B to each other.

The control signal generator 223 may generate a switching control signal SC_SIG having a disabled state and output the switching control signal SC_SIG to the switch 240. The switching control signal SC_SIG having the disabled state may control the switch 240 to disconnect the first and second pads 241A and 241B from each other.

The memory controller 200 may include a reference voltage generator 230. The reference voltage generator 230 may generate a reference voltage VREFQ. The reference voltage VREFQ may be a voltage which is compared with a signal input through the input/output pad.

The memory controller 200 may include the switch 240. The switch 240 may connect or disconnect the first and second pads 241A and 241B. The switch 240 may receive a switching control signal SC_SIG from the control signal generator 223 and thus connect or disconnect the first and second pads 241A and 241B. If the switch 240 receives a switching control signal SC_SIG having an enabled state from the control signal generator 223, the switch 240 may connect the first and second pads 241A and 241B to each other. In contrast, if the switch 240 receives a switching control signal SC_SIG having a disabled state from the control signal generator 223, the switch 240 may disconnect the first and second pads 241A and 241B from each other.

The memory device 100 may store data therein. The memory device 100 may operate under control of the memory controller 200. The memory device 100 may include a memory cell array including a plurality of memory cells configured to store data therein. The memory cell array may include a plurality of memory blocks. Each memory block may include a plurality of memory cells. Each memory block may include a plurality of pages. In an embodiment, a page may be the unit of storing data in the memory device 100 or reading stored data from the memory device 100. A memory block may be the unit of erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In this specification, aspects and features of the invention are described in the context that the memory device 100 is a NAND flash memory.

In an embodiment, the memory device 100 may be embodied in a three-dimensional array structure. The present disclosure may be applied not only to a flash memory 100 in which a charge storage layer is formed of a conductive floating gate (FG), but also to a charge trap flash (CTF) memory in which a charge storage layer is formed of an insulating layer.

In an embodiment, each of the memory cells included in the memory device 100 may be formed of a single-level cell (SLC) capable of storing one data bit. Alternatively, each of the memory cells included in the memory device 100 may be formed of a multi-level cell (MLC) capable of storing two data bits, a triple-level cell (TLC) capable of storing three data bits, or a quad-level cell (QLC) capable of storing four data bits.

The memory device 100 may receive a command and an address from the memory controller 200 and access an area of the memory cell array that is selected by the address. In other words, the memory device 100 may perform an operation corresponding to the command on the area selected by the address. For example, the memory device 100 may perform a write (program) operation, a read operation, and an erase operation. During a program operation, the memory device 100 may program data to an area selected by an address. During a read operation, the memory device 100 may read data from an area selected by an address. During an erase operation, the memory device 100 may erase data from an area selected by an address.

The memory device 100 may perform a program operation or an erase operation using a set operating voltage under control of the memory controller 200.

The memory device 100 may include a command decoder 140. The command decoder 140 may receive an offset adjustment command OC_CMD from the memory controller 200 and receive a detection completion signal DF_SIG from an offset controller. The output signal determiner 210 may generate an offset adjustment command OC_CMD, which may be output to the switch 240, which, in turn, may output, to the command decoder 140, the offset adjustment command OC_CMD. The command decoder 140 may decode the received offset adjustment command OC_CMD. The command decoder 140 may generate an offset detection signal OFD_SIG and an offset compensation signal OFC_SIG, based on the offset adjustment command OC_CMD and the detection completion signal DF_SIG. The offset detection signal OFD_SIG and an offset compensation signal OFC_SIG that are generated by the command decoder 140 may control the switches SW4 to SW6 to connect them to, or disconnect them from, each other within the offset controller 150.

The memory device 100 may include the offset controller 150. The offset controller 150 may compensate for an offset of a signal input to the input/output pad, and remove the offset based on the compensation. In detail, the offset controller 150 may compensate for the offset and store the compensated offset of the input signal as a digital code. After the compensated offset has been stored as the digital code, the offset controller 150 may generate a detection completion signal DF_SIG. After the compensated offset of the input signal has been stored as the digital code, the offset controller 150 may convert the digital code to an analog signal during an actual offset compensation operation. The offset controller 150 may reflect the converted analog signal in the input signal. The offset of the input signal may be removed by reflecting the converted analog signal in the input signal.

In an embodiment, the memory controller 200 may receive data and a logical block address LBA from the host 300, and translate the logical block address LBA into a physical block address PBA indicating addresses of memory cells to which data is to be stored, the memory cells being included in the memory device 100. In addition, the memory controller 200 may store, in a buffer memory, mapping information indicating a mapping relationship between the LBA and the PBA.

The memory controller 200 may control the memory device 100 to perform a program operation, a read operation, or an erase operation in response to a request from the host 300. During a program operation, the memory controller 200 may provide a program command, a physical block address PBA, and data to the memory device 100. During a read operation, the memory controller 200 may provide a read command and a PBA to the memory device 100. During an erase operation, the memory controller 200 may provide an erase command and a PBA to the memory device 100.

In an embodiment, the memory controller 200 may autonomously generate a program command, an address and data without a request from the host 300, and transmit them to the memory device 100. For example, the memory controller 200 may provide a command, an address and data to the memory device 100 to perform background operations such as a program operation for wear leveling, and a program operation for garbage collection.

In an embodiment, the memory controller 200 may control at least two or more memory devices 100. In this case, the memory controller 200 may control the memory devices 100 in an interleaving manner so as to enhance the operating performance.

The host 300 may communicate with the memory system 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multimedia card (MMC), an embedded MMC (eMMC), a dual in-line memory module (DIMM), a registered DIMM (RDIMM), and/or a load reduced DIMM (LRDIMM).

Figure 2:
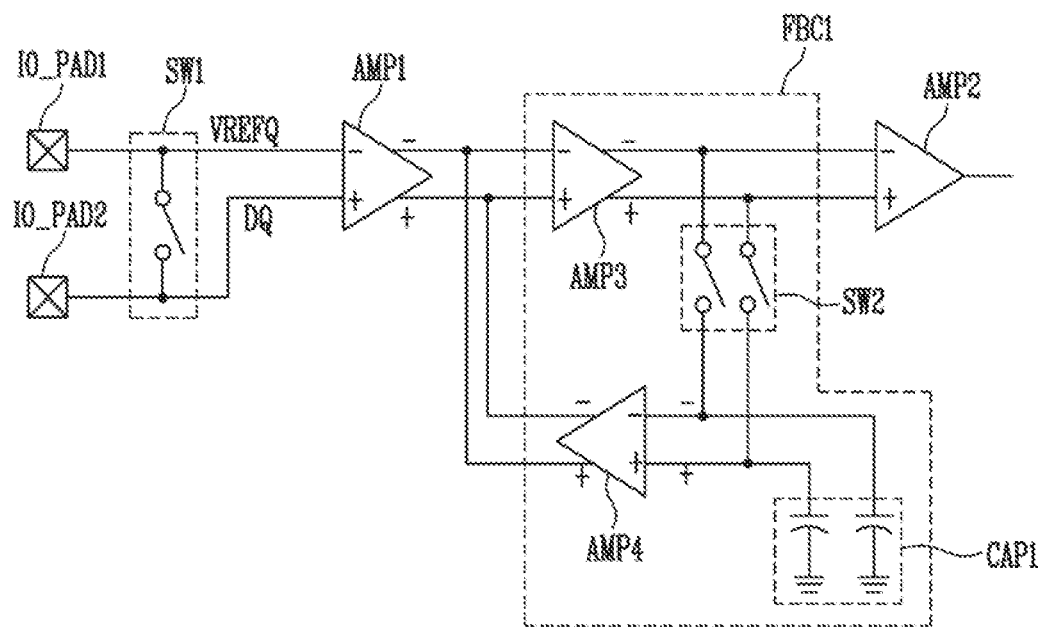
FIG. 2 is a diagram illustrating an embodiment of an offset controller of FIG. 1.

FIG. 2 is a diagram illustrating an embodiment of an offset controller 150 of FIG. 1.

Referring to FIG. 2, the offset controller 150 may include first and second input/output pads IO_PAD1 and IO_PAD2, a first switch SW1, first and second amplifiers AMP1 and AMP2, and a first feedback circuit FBC1. The first feedback circuit FBC1 may include third and fourth amplifiers AMP3 and AMP4, a second switch SW2, and a first capacitor circuit CAP1.

FIG. 2 illustrates a conventional method of removing an offset of an input signal that is input to an input/output pad.

The first and second input/output pads IO_PAD1 and IO_PAD2 in the offset controller may receive signals from an external device. The first input/output pad IO_PAD1 may receive a reference voltage signal VREFQ, which is compared to an input signal received by the second input/output pad IO_PAD2. After VREFQ and the input signal are input to the first and second input/output pads IO_PAD1 and IO_PAD2 respectively, the signals may be amplified by the first and third amplifiers AMP1 and AMP3. Then, the reference voltage signal VREFQ and the input signal are compared with each other by the second amplifier AMP2, and a result of the comparison may be amplified and output.

An offset may be included in a signal which is input to the first and second input/output pads IO_PAD1 and IO_PAD2. When a signal is input from an external device, a direct current (DC) component offset may be added to the input signal during a signal input process. In this case, the input signal which is provided to the memory device 100 may be modulated, whereby the memory device 100 may not perform an operation.

Therefore, the conventional memory device may disconnect the first and second switches SW1 and SW2, connect the first and second input/output pads IO_PAD1 and IO_PAD2, block an input signal to be input from the external device to the input/output pad, and perform an operation of storing the offset to be input. After the offset has been stored, the conventional memory device may open the first and second switches SW1 and SW2 and disconnect the first and second input/output pads IO_PAD1 and IO_PAD2 from each other, and thus perform an operation of compensating for the DC component offset in the input signal to be input from the external device to the input/output pad.

In detail, the conventional memory device may perform an operation of storing an offset in a signal input to the first and second input/output pads IO_PAD1 and IO_PAD2. In other words, if the first switch SW1 is disconnected and an input signal to be input from the external device to the second input/output pad IO_PAD2 is blocked, only the reference voltage signal VREFQ may be input to the first input/output pad IO_PAD1. Hence, signals to be input to respective terminals of the first amplifier AMP1 may be as the same, e.g., both may be the reference voltage signal VREFQ.

A DC component offset may be included in the reference voltage signal VREFQ to be input to the both terminals of the first amplifier AMP1. The DC component offset may be changed depending on terminals. In other words, the offset in each of the signals to be input to the first amplifier AMP1 may be changed depending on whether a terminal to which the signal is input is an inverting input terminal (−) or a non-inverting input terminal (+).

The reference voltage signal VREFQ input to the both terminals of the first amplifier AMP1 may be amplified by the first amplifier AMP1. The signal amplified by the first amplifier AMP1 may be amplified by the third amplifier AMP3. The DC component offset in the signal amplified by the third amplifier AMP3 may be stored in the first capacitor circuit CAP1.

The memory device 100 may store an offset included in signals input to the first and second input/output pads IO_PAD1 and IO_PAD2, and then perform an operation of compensating for the offset included in the signals input to the first and second input/output pads IO_PAD1 and IO_PAD2.

In detail, after the offset has been stored in the first capacitor circuit CAP1, the first and second switches SW1 and SW2 may open. As the first switch SW1 opens, an input signal may be input to the second input/output pad IO_PAD2. As the second switch SW2 opens, the offset stored in the first capacitor circuit CAP1 may be amplified by the fourth amplifier AMP4. The offset amplified by the fourth amplifier AMP4 may be output to an input terminal of the third amplifier AMP3. In detail, an offset input through an inverting output terminal (−) of the third amplifier AMP3 may be output to a non-inverting input terminal (+) of the third amplifier AMP3. Furthermore, an offset input through a non-inverting output terminal (+) of the third amplifier AMP3 may be output to an inverting input terminal (−) of the third amplifier AMP3. Therefore, the signal amplified by the first amplifier AMP1 may be compensated for by a signal used to amplify the offset stored in the first capacitor circuit CAP1, whereby a DC component offset in the signal amplified by the first amplifier AMP1 may be removed.

If the offset stored in the first capacitor circuit CAP1 is compensated for by the reference voltage signal VREFQ and the input signal, the compensated value may be amplified by the third amplifier AMP3. Signals amplified by the third amplifier AMP3 may be compared by the second amplifier AMP2. The third amplifier AMP3 may output a comparison signal in response to a result of the comparison.

However, in the conventional operation of removing an offset having a direct current component, there is a probability that capacitors in the first capacitor circuit CAP1 may be discharged by leakage of charges stored therein. Hence, there is a problem in that each of the capacitors in the first capacitor circuit CAP1 is required to have a relatively large size. Also, there is a problem in that the operation of storing an offset in the first capacitor circuit CAP1 is required to be periodically performed to remove the offset included in the input signal.

To overcome the foregoing problems, a method of removing an offset in accordance with embodiments of the present disclosure is described with reference to FIGS. 3 and 4.

Figure 3:
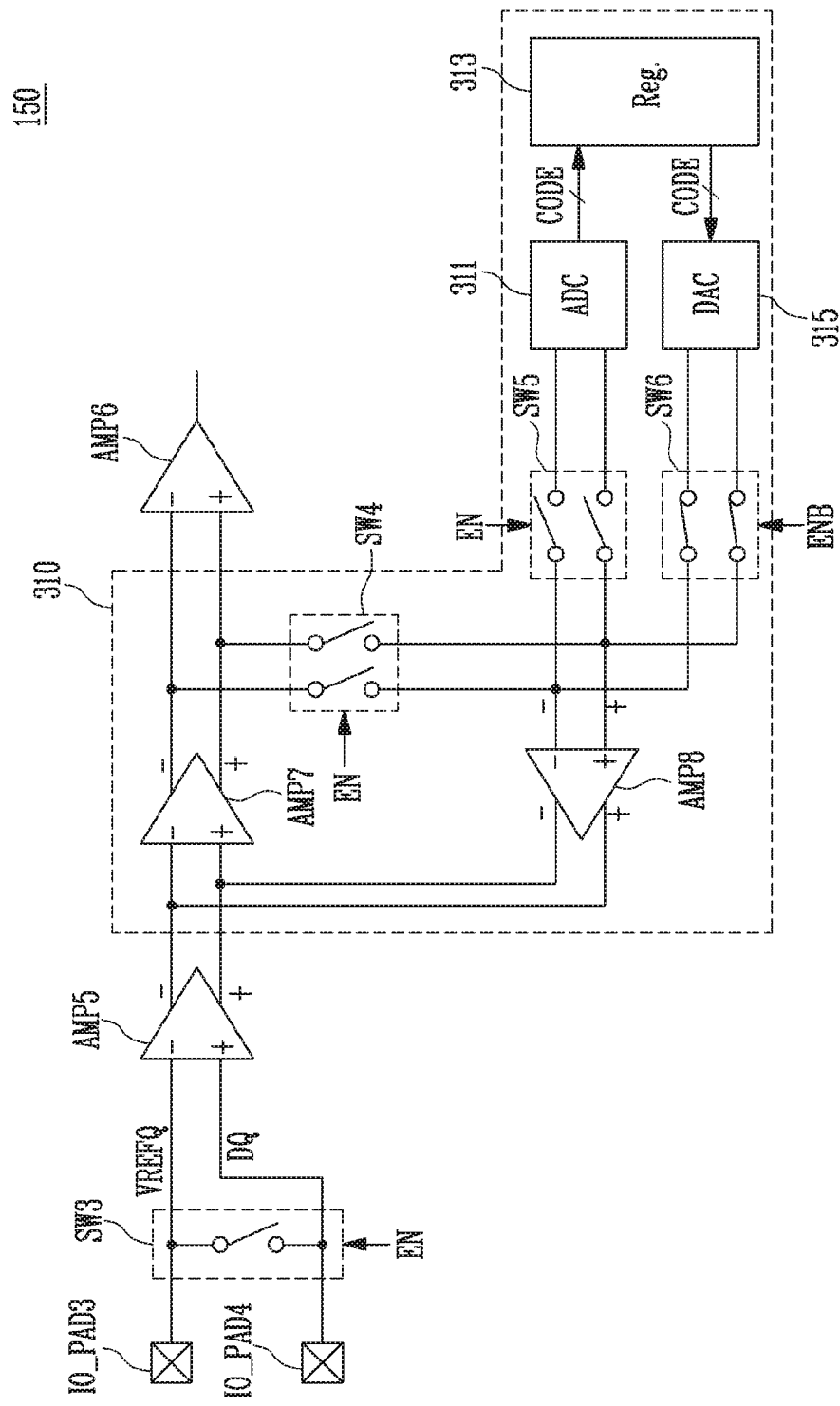
FIG. 3 is a diagram illustrating an embodiment of the offset controller of FIG. 1.

FIG. 3 is a diagram illustrating an embodiment of the offset controller 150 of FIG. 1.

Referring to FIG. 3, the offset controller 150 may include third and fourth input/output pads IO_PAD3 and IO_PAD4, a third switch SW3, fifth and sixth amplifiers AMP5 and AMP6, and a feedback circuit 310. The feedback circuit may include seventh and eighth amplifiers AMP7 and AMP8, fourth, fifth, and sixth switches SW4, SW5, and SW6, a first converter 311, a second converter 315, and a register (Reg.) 313. The first and second converters 311 and 315 may be an analog-digital converter (ADC) and a digital-analog converter (DAC), respectively.

In an embodiment, the third switch SW3 may connect first and second paths to each other. The first path may be between the third input/output pad IO_PAD3 and an inverting terminal (−) of the fifth amplifier AMP5 and the second path may be between the fourth input/output pad IO_PAD4 and a non-inverting terminal (+) of the fifth amplifier AMP5. The fourth and fifth switches SW4 and SW5 may couple the seventh amplifier AMP7 and the first converter 311 to each other. The sixth switch SW6 may couple the eighth amplifier AMP8 and the second converter 315 to each other.

The third and fourth input/output pads IO_PAD3 and IO_PAD4 included in the offset controller 150 may receive signals from an external device. For example, the third and fourth input/output pads IO_PAD3 and IO_PAD4 may receive signals from the memory controller 200. The third input/output pad IO_PAD3 may receive a reference voltage signal VREFQ, which is compared with an input signal that is received by the fourth input/output pad IO_PAD4. These signals, after being input to the third and fourth input/output pads IO_PAD3 and IO_PAD4, may be amplified by the fifth and seventh amplifiers AMP5 and AMP7. Then, the reference voltage signal VREFQ and the input signal are compared with each other by the sixth amplifier AMP6, and a result of the comparison may be amplified and output.

The offset controller 150 may perform an operation of removing an offset included in the signals input to the third and fourth input/output pads IO_PAD3 and IO_PAD4. The offset in these signals may include a direct current component.

Unlike the offset controller of FIG. 2, the offset controller 150 of FIG. 3 may include a plurality of switches 240 and receive control signals for controlling the plurality of switches 240. Furthermore, the offset controller 150 of FIG. 3 may perform an operation of storing, as a digital code, the offset in the signals input to the third and fourth input/output pads IO_PAD3 and IO_PAD4, and an operation of converting the stored digital code to an analog signal.

In detail, the offset controller 150 may perform an operation of storing the offset in the signals input to the third and fourth input/output pads IO_PAD3 and IO_PAD4. In an embodiment, the offset controller 150 may receive an enable signal EN having an enabled state for controlling connection of the third switch SW3. If the enable signal EN having the enabled state is input to the third switch SW3, the third and fourth input/output pads IO_PAD3 and IO_PAD4 may be connected to each other. If s IO_PAD3 and IO_PAD4 are connected to each other, the signal that is input to the fourth input/output pad IO_PAD4 may be blocked. In that case, the reference voltage signal VREFQ input through the third input/output pad IO_PAD3 may be input to both input terminals of the fifth amplifier AMP5. In that case, the fifth amplifier AMP5 may amplify the reference voltage signal VREFQ.

In an embodiment, the enable signal EN input to the third switch SW3 may be internally generated in the memory device 100. For example, the memory device 100 may generate an enable signal EN that is enabled during an idle time. In an embodiment, the command decoder 140 of the memory device 100 may generate an enable signal EN which is enabled when the memory device 100 receives no command from the memory controller 200 and thus is in an idle state, and transmit the generated enable signal EN to the offset controller 150. In this case, the offset controller 150 may perform an operation of storing an offset included in the signal input to the third and fourth input/output pads IO_PAD3 and IO_PAD4 during an idle time of the memory device 100.

In an embodiment, the enable signal EN input to the third switch SW3 may be generated under control of the memory device 200. For example, the memory controller 200 may generate a command for storing the offset included in the signal input to the third and fourth input/output pads IO_PAD3 and IO_PAD4 of the memory device 100, and transmit the command to the memory device 100. The command decoder 140 of the memory device 100 may decode the received command and generate the enable signal EN in the enabled state. The generated enable signal EN may be input to the third switch SW3.

When the enable signal EN having the enabled state is input to the third switch SW3, an enable signal EN having an enabled state may be input to each of the fourth and fifth switches SW4 and SW5. A disable signal ENB having a disabled state may be input to the sixth switch SW6. If the enable signal EN having the enabled state is input to each of the fourth and fifth switches SW4 and SW5, the fourth and fifth switches SW4 and SW5 may form a path from the signal receiver AMP5 to the first converter 311. If the disable signal ENB having the disabled state is input to the sixth switch SW6, the sixth switch SW6 may disconnect a path from the second converter 315 to the signal receiver AMP5. If the fourth and fifth switches SW4 and SW5 form the path from the signal receiver AMP5 to the first converter 311 and the sixth switch SW6 disconnects the path from the second converter 315 to the signal receiver AMP5, the operation of storing the DC component offset of the signal input to the third and fourth input/output pads IO_PAD3 and IO_PAD4 may be completed.

The signal input to the third and fourth input/output pads IO_PAD3 and IO_PAD4 may be amplified by the fifth and seventh amplifiers AMP5 and AMP7. The DC component offset may be included in the amplified signal. The DC component offset may be changed depending on input/output terminals of an amplifier. In other words, the magnitude of the offset included in the amplified signal may be changed depending on whether the input/output terminal is an inverting terminal (−) or a non-inverting terminal (+).

The amplified signal may be provided to a first converter 311 through the fourth and fifth switches SW4 and SW5. The first converter 311 may convert the DC component offset in the amplified signal to a digital code and store it in the register 313. In other words, the first converter 311 may convert an analog signal including the offset to a digital code and store it in the register 313.

If the digital code is stored in the register 313, the offset controller 150 may perform an operation of compensating for the offset in the signal input to the third and fourth input/output pads IO_PAD3 and IO_PAD4.

In an embodiment, the offset controller 150 may receive an enable signal EN having a disabled state for disconnecting the third switch SW3. If the enable signal EN having the disabled state is input to the third switch SW3, the third and fourth input/output pads IO_PAD3 and IO_PAD4 may be disconnected from each other. In that case, the input signal DQ may be input to the fourth input/output pad IO_PAD4. Hence, the reference voltage signal VREFQ input through the third input/output pad IO_PAD3 may be input to the inverting input terminal (−) of the fifth amplifier AMP5. The input signal DQ input through the fourth input/output pad IO_PAD4 may be input to the non-inverting input terminal (+) of the fifth amplifier AMP5. If the signals VREFQ and DQ are input to the corresponding terminals of the fifth amplifier AMP5, the fifth amplifier AMP5 may amplify these input signals.

When the enable signal EN having the disabled state is input to the third switch SW3, an enable signal EN having a disabled state may be input to each of the fourth and fifth switches SW4 and SW5. A disable signal ENB having an enabled state may be input to the sixth switch SW6. If the enable signal EN having the disabled state is input to each of the fourth and fifth switches SW4 and SW5, the fourth and fifth switches SW4 and SW5 may disconnect the path from the signal receiver AMP5 to the first converter 311. If the disable signal ENB having the enabled state is input to the sixth switch SW6, the sixth switch SW6 may form the path from the second converter 315 to the signal receiver AMP5. If the fourth and fifth switches SW4 and SW5 disconnects the path from the signal receiver AMP5 to the first converter 311 and the sixth switch SW6 forms a path from the second converter 315 to the signal receiver AMP5, the memory device 100 perform an operation of compensating for the DC component offset of the signals VREFQ and DQ input to the third and fourth input/output pads IO_PAD3 and IO_PAD4.

The digital code stored in the register 313 may be converted to an analog signal through the second converter 315. The converted analog signal may be output to input terminals of the seventh amplifier AMP7. In detail, an analog signal that is obtained by converting a digital code for an offset included in the reference voltage signal VREFQ output through an inverting output terminal (−) of the seventh amplifier AMP7, among the signals amplified by the fifth and seventh amplifiers AMP5 and AMP7, may be output to a non-inverting input terminal (+) of the seventh amplifier AMP7 through the eighth amplifier AMP8. An analog signal that is obtained by converting a digital code for an offset included in the reference voltage signal VREFQ output through a non-inverting output terminal (+) of the seventh amplifier AMP7, among the signals amplified by the fifth and seventh amplifiers AMP5 and AMP7, may be output to an inverting input terminal (−) of the seventh amplifier AMP7 through the eighth amplifier AMP8. The eighth amplifier AMP8 may amplify a converted analog signal.

If digital codes stored in the register 313 are converted to analog signals and then output to the input terminals of the seventh amplifier AMP7, an offset of the signals VREFQ and DQ amplified by the fifth amplifier AMP5 may be compensated for. The seventh amplifier AMP7 may amplify the signals VREFQ and DQ of which the offset is compensated for. The sixth amplifier AMP6 may compare the signals VREFQ and DQ amplified by the seventh amplifier AMP7 and output a signal generated in response to a result of the comparison.

Figure 4:
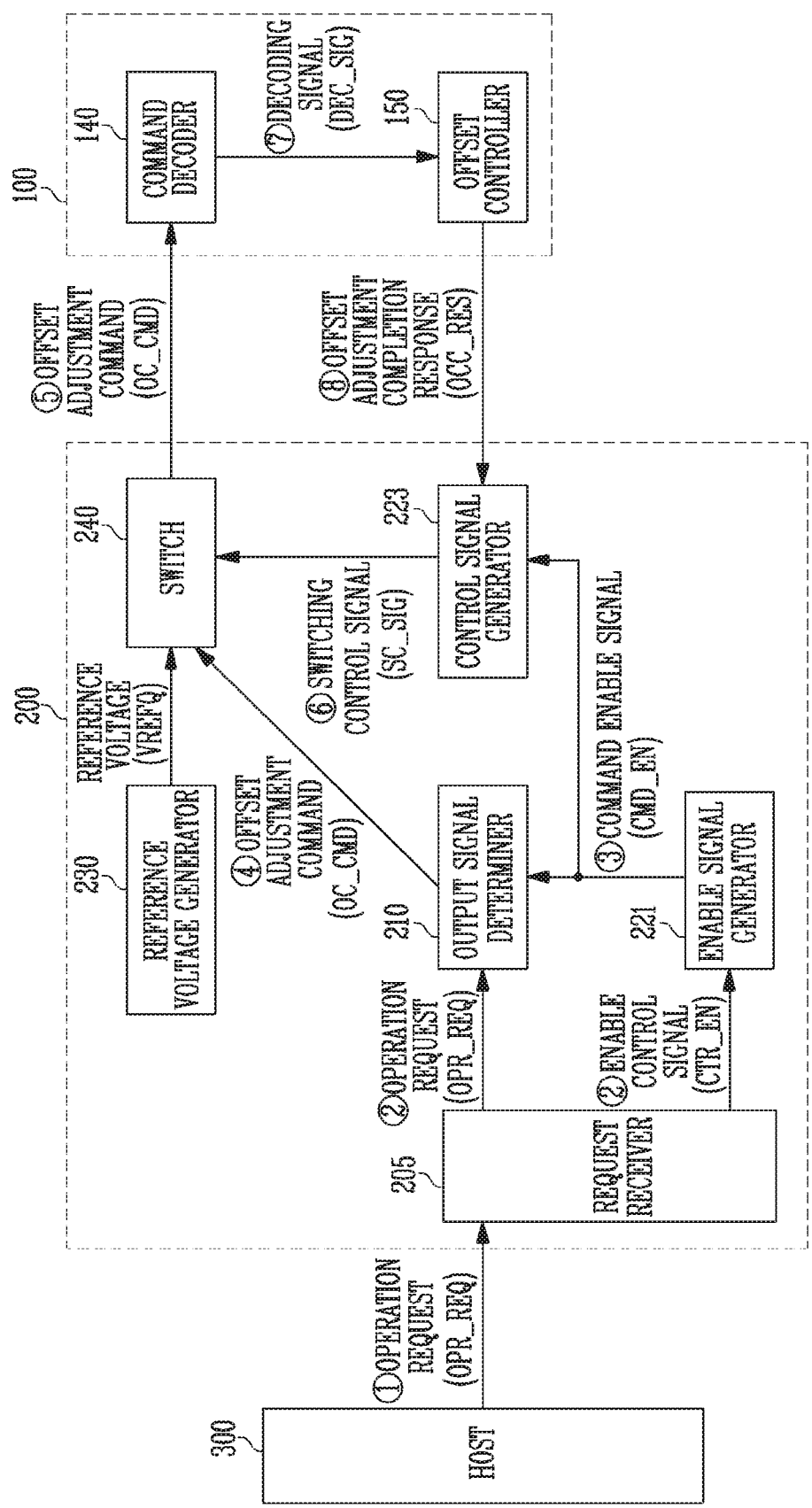
FIG. 4 is a diagram illustrating configurations of a memory controller and a memory device of FIG. 1.

FIG. 4 is a diagram illustrating configurations of the memory controller 200 and the memory device 100 of FIG. 1.

Referring to FIG. 4, the memory controller 200 of FIG. 4 may include a request receiver 205, the output signal determiner 210, the enable signal generator 221, the control signal generator 223, the reference voltage generator 230, and the switch 240. The memory device 100 of FIG. 4 may include the command decoder 140 and the offset controller 150.

In the conventional art, a circuit of removing an offset from an input signal is included in the memory device, and the memory device autonomously performs an offset removal operation without control by the memory controller.

The memory device also autonomously performs an operation of compensating for an offset. However, in an embodiment of FIG. 4, the operation of compensating for an offset of an input signal may be performed not only by the memory device 100 but also by control of the memory controller 200.

In other words, FIG. 4 illustrates a configuration in which the memory controller 200 controls the memory device 100 to compensate for an offset of an input signal input to the memory device 100. Below, configurations of the memory controller 200 and the memory device 100 for compensating for an offset of an input signal are described.

The memory controller 200 may include the request receiver 205. The request receiver 205 may receive a request from the host 300 (as indicated by ①). In an embodiment, the request received from the host may be an operation request OPR_REQ. Although not illustrated in FIG. 4, the request receiver 205 may also receive data from the host 300.

The request receiver 205 may transmit the received operation request OPR_REQ to the output signal determiner 210, and may generate an enable control signal CTR_EN and transmit the enable control signal CTR_EN to the enable signal generator 221 (as indicated by ②). The enable control signal CTR_EN may be a signal for controlling the operation of the enable signal generator 221.

The memory controller 200 may include the output signal determiner 210. The output signal determiner 210 may receive the request from the request receiver 205. As described above, the request received from the host 300 through the request receiver 205 may be an operation request OPR_REQ. The operation request OPR_REQ may be any of an offset adjustment request, a program (write) request, a read request, and an erase request. The output signal determiner 210 may generate a command based on the received request. The command generated by the output signal determiner 210 may be a command for performing an operation corresponding to the request of the host 300 on the memory device 100.

If the received operation request OPR_REQ is an operation request OPR_REQ for adjusting an offset, the output signal determiner 210 may receive a command enable signal CME_EN having an enabled state from the enable signal generator 221 (as indicated by ③) and generate an offset adjustment command OC_CMD. The generated offset adjustment command OC_CMD may be output to the switch 240 (as indicated by ④). Alternatively, the output signal determiner 210 may determine to adjust for an offset regardless of the operation request OPR_REQ received from the host 300 through the request receiver 205, and output the offset adjustment command OC_CMD to the switch 240 in response to the command enable signal CMD_EN having the enabled state.

The output signal determiner 210 may output a command based on the command enable signal CMD_EN. In other words, when receiving the command enable signal SMD_EN having the enabled state, the output signal determiner 210 may output a command for performing an operation on the memory device 100.

In response to the enable control signal CTR_EN received from the request receiver 205, the enable signal generator 221 may generate a signal for controlling the output signal determiner 210 and/or the control signal generator 223. In an embodiment, the enable signal generator 221 may output the command enable signal CMD_EN for controlling the output signal determiner 210 (as indicated by ③).

In an embodiment, the enable signal generator 221 may generate the command enable signal CMD_EN for controlling the output signal determiner 210 to generate a command and transmit the command to the memory device 100. If the output signal determiner 210 receives a command enable signal CMD_EN having an enabled state, the generated command may be input to the input/output pad. If the output signal determiner 210 receives a command enable signal CMD_EN having a disabled state, no command is input to the input/output pad.

The control signal generator 223 may generate a signal for controlling the switch 240.

In an embodiment, the control signal generator 223 may generate a signal for controlling the switch 240. The signal for controlling the switch 240 may be a switching control signal SC_SIG. If the switch 240 receives a switching control signal SC_SIG having an enabled state, the first and second pads 241A and 241B may be connected to each other. If the switch 240 receives a switching control signal SC_SIG having a disabled state, the first and second pads 241A and 241B may be disconnected from each other. Each of the first and second pads 241A and 241B may be coupled to the memory device 100 (see FIG. 5).

The reference voltage generator 230 may generate a reference voltage VREFQ. The reference voltage VREFQ may be output to the memory device 100 through the first pad 241A. The reference voltage VREFQ may be a signal which is compared with an input signal that is input to the second pad 241B.

The switch 240 may output, to the memory device 100, the offset adjustment command OC_CMD received from the output signal determiner 210 (as indicated by ⑤). If the offset adjustment command OC_CMD is output to the memory device 100, the memory controller 200 and the memory device 100 may perform an operation for adjusting for an offset of a signal input to the memory device 100.

The memory controller 200 may perform an operation of controlling the memory device 100 to adjust a DC component offset of a signal input to the memory device 100. In an embodiment, the control signal generator 223 may output a switching control signal SC_SIG having an enabled state for controlling the switch 240 (as indicated by ⑥). If the switch 240 receives the switching control signal SC_SIG having the enabled state, the switch 240 may couple the first and second pads 241A and 241B to each other. If the first and second pads 241A and 241B are connected to each other, only the reference voltage signal VREFQ may be input to the memory device 100 through the first and second pads 241A and 241B. Therefore, the memory device 100 may perform an operation of amplifying the reference voltage signal VREFQ and storing the DC component offset included in the amplified signal VREFQ as a digital code.

The memory device 100 may decode the offset adjustment command OC_CMD received from the memory controller 200. In detail, the command decoder 140 included in the memory device 100 may decode the offset adjustment command OC_CMD and generate a decoding signal DEC_SIG. The decoding signal DEC_SIG may include an offset detection signal OFD_SIG and an offset compensation signal OFC_SIG.

The decoding signal DEC_SIG generated by the command decoder 140 may be provided to the offset controller 150 (as indicated by ⑦). As the decoding signal DEC_SIG corresponding to the offset adjustment command OC_CMD is received, the offset controller 150 may be converted from an offset compensation mode to an offset detection mode. In the offset detection mode, the offset controller 150 may detect an offset of a signal input through the first and second pads 241A and 241B. In detail, the decoding signal DEC_

SIG may control the plurality of switches included in the offset controller 150. In response to the decoding signal DEC_SIG, the offset of the signal input through the first and second pads 241A and 241B may be stored in the register 313 as a digital code. An existing offset that has been stored in the register 313 may be removed, and a new detected offset may be stored in the register 313. In this way, the offset controller 150 may compensate the offset of the signal input through the first and second pads 241A and 241B.

If the offset currently detected in the offset detection mode is stored in the register 313, the offset controller 150 may be converted from the offset detection mode to the offset compensation mode. In the offset compensation mode, the digital code stored in the register 313 may be converted to an analog signal. The converted analog signal is transmitted to the first and second pads 241A and 241B, thus compensating for the offset.

If the offset controller 150 is converted from the offset detection mode to the offset compensation mode, the offset controller 150 may output an offset adjustment completion response OCC_RES (as indicated by ⑧). The control signal generator 223 may receive the offset adjustment completion response OCC_RES and generate signals for controlling the switch 240 to output a command to the memory device 100.

In an embodiment, the offset controller 150 may not output the offset adjustment completion response OCC_RES. If the offset controller 150 does not output the offset compensation adjustment response OCC_RES, the decoding signal DEC_SIG generated by the command decoder 140 may be maintained in an enabled state or a disabled state for a set time.

If the control signal generator 223 receives the offset adjustment completion response OCC_RES from the offset controller 150, the control signal generator 223 may generate a switching control signal SC_SIG for controlling the switch 240 so that the switch 240 is disconnected. If a switching control signal SC_SIG having a disabled state is received, the switch 240 may disconnect the first and second pads 241A and 241B from each other so that a command is input to the second pad 241B and the input command is output to the memory device 100.

FIG. 5 is a diagram illustrating a method of outputting the offset adjustment command OC_CMD to the memory device 100 of FIG. 1 in accordance with an embodiment.

Referring to FIG. 5, the memory controller 200 in accordance with an embodiment may include a request receiver 205, an output signal determiner 210, an enable signal generator 221, a reference voltage generator 230, and a switch 240.

FIG. 5 illustrates a process of outputting an offset adjustment command OC_CMD from the memory controller 200 to the memory device 100. The offset adjustment command OC_CMD may be for adjusting a DC component offset included in signals to be received to the memory device 100. In detail, the offset adjustment command OC_CMD may be for instructing to store a new DC component offset of a signal to be received to the memory device 100.

A signal to be received to the memory device 100 may be provided through the input/output pad including the first and second pads 241A and 241B each coupled to the memory device 100. In terms of the memory controller 200, the first and second pads 241A and 241B may be designated as "output pads" because they output a signal to the memory device 100. The first pad 241A may provide a reference voltage VREFQ. The second pad 241B may provide an output signal. Particularly, when the memory controller 200 controls an offset adjustment operation of the memory device 100, the memory controller 200 may provide an offset adjustment command OC_CMD to the memory device 100 through the second pad 241B as an output signal.

In an embodiment, the request receiver 205 may receive an operation request OPR_REQ from the host 300 (as indicated by ①). The request receiver 205 may transmit the received operation request OPR_REQ to the output signal determiner 210, and may generate an enable control signal CTR_EN having an enabled state and transmit the enable control signal CTR_EN to the enable signal generator 221 (②). The output signal determiner 210 may generate and output a command corresponding to the received operation request OPR_REQ. Alternatively, if it is decided that a specific operation is performed on the memory device by an internal operation of the memory controller 200, the output signal determiner 210 may generate and output a command without an operation request OPR_REQ received from the host 300 through the request receiver 205.

In an embodiment, the operation request OPR_REQ received from the host 300 may be any of an offset adjustment request, a program (write) request, a read request, and an erase request. In the case where operation request OPR_REQ received from the host 300 is an offset adjustment request, the request receiver 205 may transmit the received offset adjustment request to the output signal determiner 210, and may generate an enable control signal CTR_EN having an enabled state and transmit the enable control signal CTR_EN to the enable signal generator 221. The output signal determiner 210 may generate and output an offset adjustment command OC_CMD for performing an operation corresponding to the received offset adjustment request.

In an embodiment, if it is decided to adjust an offset of a signal input to the memory device 100 in the memory controller 200, the output signal determiner 210 may generate and output an offset adjustment command OC_CMD regardless of a request from the host 300.

The enable signal generator 221 may generate a command enable signal CMD_EN having an enabled state in response to the enable control signal CTR_EN having the enabled state, and transmit the command enable signal CMD_EN to the output signal determiner 210 and the control signal generator 223 (as indicated by ③). The output signal determiner 210 may output the offset adjustment command OC_CMD, in response to the command enable signal CMD_EN that has the enabled state and is received from the enable signal generator 221. In the case where the command enable signal CMD_EN having the enabled state is not received, the output signal determiner 210 is not able to output the offset adjustment command OC_CMD even when an operation request OPR_REQ is received from the request receiver 205 and it is decided to internally perform an operation in the memory controller 200. Therefore, when the command enable signal CMD_EN having the enabled state is received, the output signal determiner 210 may provide the offset adjustment command OC_CMD to the memory device 100 in the form of an output signal through the second pad 241B (as indicated by ④).

In an embodiment, the enable signal generator 221 may generate the command enable signal CMD_EN for controlling the output signal determiner 210. The command enable signal CMD_EN having an enabled state may be a signal for controlling the memory controller 200 to output the offset adjustment command OC_CMD to the memory device 100. The enable signal generator 221 may output the command enable signal CMD_EN having an enabled state for controlling the memory controller 200 to output the offset adjustment command OC_CMD to the memory device 100.

The reference voltage generator 230 may generate the reference voltage VREFQ to be input to the first pad 241A of the first and second pads 241A and 241B included in the input/output pad of the memory controller 200. The reference voltage VREFQ generated by the reference voltage generator 230 may be input to the first pad 241A and output to the memory device 100. The reference voltage VREFQ generated by the reference voltage generator 230 may be compared to a signal to be input to the second pad 241B.

The switch 240 may connect or disconnect third and fourth paths. The third path may be between the reference voltage generator 230 and the first pad 241A and the fourth path may be between the output signal determiner 210 and the second pad. Until the offset adjustment command OC_CMD is output to the memory device 100, the switch 240 may disconnect the first and second pads 241A and 241B from each other. After the offset adjustment command OC_CMD has been output to the memory device 100, the switch 240 may connect the first and second pads 241A and 241B to each other in response to a switching control signal SC_SIG having an enabled state. In other words, the switch 240 may connect the third and fourth paths to each other. As described above, the third path may be between the reference voltage generator 230 and the first pad 241A and the fourth path may be between the output signal determiner 210 and the second pad.

The memory controller 200 may include the input/output pad coupled to the memory device 100 to control the memory device 100. The input/output pad may include the first and second pads 241A and 241B. The first and second pads 241A and 241B may be respectively coupled to third and fourth pads 151A and 151B included in an input/output pad of the memory device 100. In terms of the memory device 100, the third and fourth pads 151A and 151B may be designated as "input pads" because they receive a signal from the memory controller 200.

In an embodiment, if the reference voltage VREFQ is input to the first pad 241A included in the input/output pad of the memory controller 200, the reference voltage VREFQ may be output to the memory device 100 through the first pad 241A. In detail, the reference voltage VREFQ output from the memory controller 200 may be input to the third pad 151A included in the input/output pad of the memory device 100. In other words, the offset adjustment command OC_CMD output through the first pad 241A may be input to the third pad 151A, and the memory device 100 may perform an operation of adjusting a DC component offset included in an input signal based on the offset adjustment command OC_CMD.

In an embodiment, if an output signal is input to the second pad 241B included in the input/output pad of the memory controller 200, an output signal may be output to the memory device 100 through the second pad. In terms of the memory device 100, the output signal that is output through the second pad may be designated as an input signal. In detail, the output signal that is output through the second pad 241B may be input to the fourth pad 151B as an input signal to the memory device 100.

Figure 6:
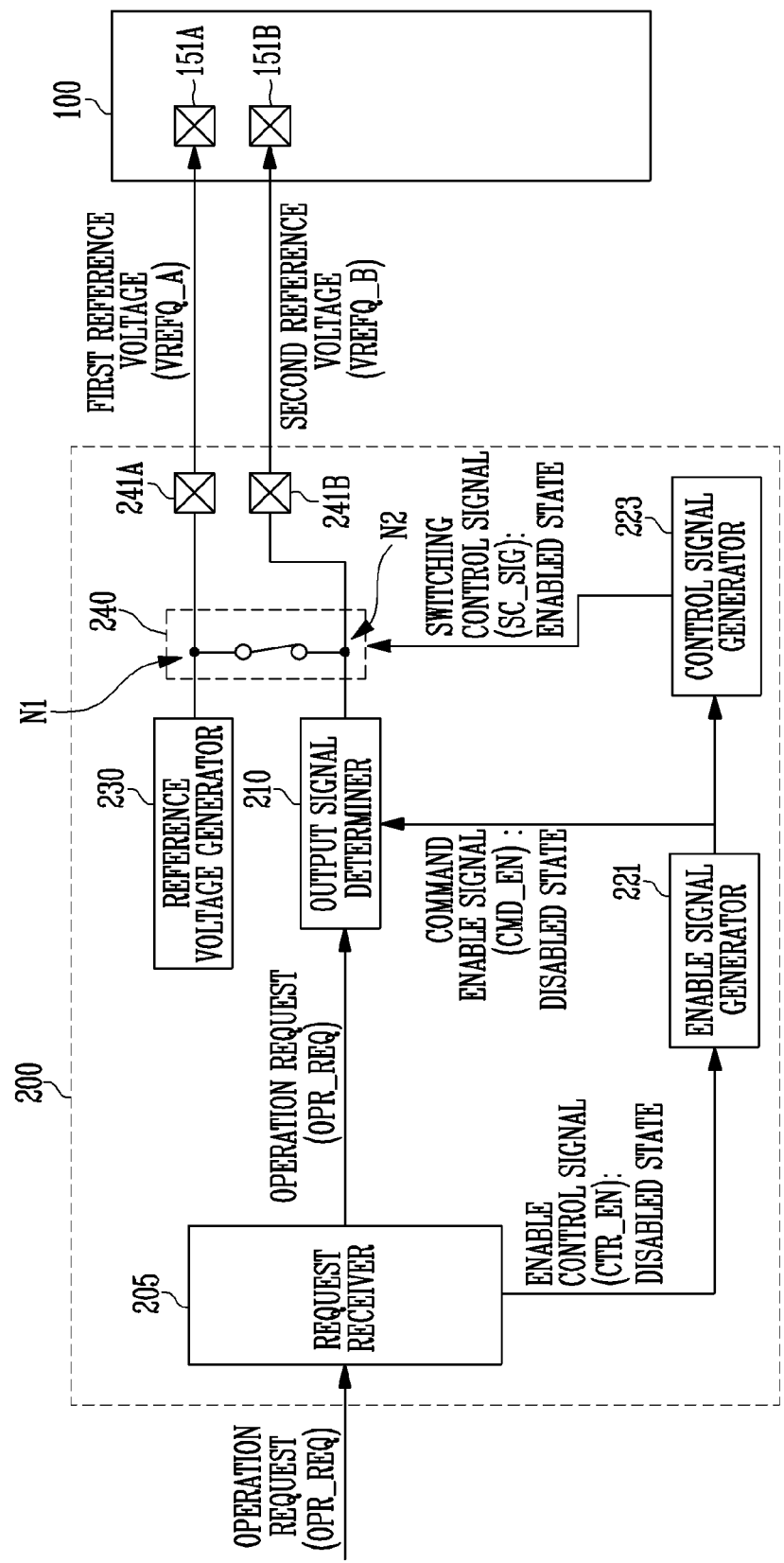
FIG. 6 is a diagram illustrating an operation of the memory controller after an offset adjustment command has been output to the memory device of FIG. 1 in accordance with an embodiment.

FIG. 6 is a diagram illustrating an operation of the memory controller 200 after the offset adjustment command OC_CMD has been output to the memory device of FIG. 1 in accordance with an embodiment.

Referring to FIGS. 5 and 6, the memory controller 200 in accordance with an embodiment may include the request receiver 205, the output signal determiner 210, the control signal generator 223, the reference voltage generator 230, and the switch 240.

FIG. 6 illustrates a method of performing an operation of adjusting an offset of an input signal by the memory controller 200 after the offset adjustment command OC_CMD is output from the memory controller 200 to the memory device 100.

After the offset adjustment command OC_CMD is output to the memory device 100, the request receiver 205 may generate an enable control signal CTR_EN having a disabled state and transmit the enable control signal CTR_EN to the enable signal generator 221. To this end, after a set time has passed from a time at which the request receiver 205 receives the offset adjustment request and transmits the offset adjustment request to the output signal determiner 210, the request receiver 205 may generate the enable control signal CTR_EN having the disabled state and transmit the enable control signal CTR_EN to the enable signal generator 221. The enable signal generator 221 may generate a command enable signal CMD_EN having a disabled state in response to the enable control signal CTR_EN having the disabled state. In response to the command enable signal CMD_EN having the disabled state, the output signal determiner 210 may not input a command to the input/output pads 241A and 241B. In response to the command enable signal CMD_EN having the disabled state, the control signal generator 223 may generate the switching control signal SC_SIG for controlling the switch 240. In detail, the control signal generator 223 may generate the switching control signal SC_SIG for controlling connection of the first and second pads 241A and 241B included in the memory controller 200.

In an embodiment, in response to the command enable signal CMD_EN having the disabled state, the control signal generator 223 may generate the switching control signal SC_SIG having an enabled state. The switching control signal SC_SIG having the enabled state may be a signal for controlling the switch 240 to connect the first and second pads 241A and 241B to each other. The switching control signal SC_SIG having the enabled state may be provided to the switch 240.

If the switch 240 receives the switching control signal SC_SIG having the enabled state, the switch 240 may connect the first and second pads 241A and 241B to each other. In other words, when the switching control signal SC_SIG having the enabled state is received, the switch 240 may connect the third path between the reference voltage generator 230 and the first pad 241A and the fourth path between the output signal determiner 210 and the second pad 241B.

In an embodiment, the enable signal generator 221 may output a command enable signal CMD_EN having a disabled state to the output signal determiner 210. The command enable signal CMD_EN having the disabled state may control the output signal determiner 210 to interrupt generation of a signal to be input from the output signal determiner 210 to the second pad 241B.

In response to the command enable signal CMD_EN having the disabled state, the output signal determiner 210 may interrupt the output of a signal to the second pad 241B. The signal input to the second pad 241B may be a signal for a command, an address, and data. Therefore, although the output signal determiner 210 receives an operation request from the host 300, the output signal determiner 210 may not output a command corresponding to the operation request OPR_REQ while the command enable signal CMD_EN stays disabled. Also, although it has been decided to perform a specific operation on the memory device 100, the output signal determiner 210 may not output a command for instructing the memory device 100 to perform the operation while the command enable signal CMD_EN stays disabled.

In other words, when a switching control signal SC_SIG having an enabled state is received, the third path between the reference voltage generator 230 and the first pad 241A and the fourth path between the output signal determiner 210 and the second pad 241B may be connected to each other. In more detail, a first node N1 between the reference voltage generator 230 and the first pad 241A and a second node N2 between the output signal determiner 210 and the second pad 241B may be connected to each other. The reference voltage generator 230 may provide the reference voltage to the first pad 241A through the first node N1. The output signal determiner 210 may interrupt the supply of the offset adjustment command OC_CMD while the command enable signal CMD_EN stays disabled. If the output signal determiner 210 interrupts generation of the offset adjustment command OC_CMD to be input to the second pad 241B and the switch 240 connects the first node N1 and the second node N2 to each other, the reference voltage signal VREFQ output from the reference voltage generator 230 may be input through the first and second pads 241A and 241B. However, because of various reasons such as noise, a first reference voltage VREFQ_A received to the third pad 151A of the memory device 100 may differ from a second reference voltage VREFQ_B received to the fourth pad 151B. If the first reference voltage signal VREFQ_A is input to the third pad 151A and the second reference voltage signal VREFQ_B is input to the fourth pad 151B, the memory device 100 may perform an operation of adjusting a DC component offset included in the input signals. In detail, the offset of the third pad 151A and the fourth pad 151B may be a value corresponding to a difference between the first reference voltage VREFQ_A and the second reference voltage VREF_B.

In an embodiment, if the memory device 100 completes the operation of adjusting the offset, the control signal generator 223 may generate a switching control signal SC_SIG having a disabled state.

In detail, the control signal generator 223 may generate a switching control signal SC_SIG having a disabled state for controlling the switch 240 to disconnect the first and second pads 241A and 241B from each other. Generated by the control signal generator 223, the switching control signal SC_SIG having the disabled state may be provide to the switch 240. Thereby, the switch 240 may disconnect the first node N1 from the second node N2 from each other.

In an embodiment, the control signal generator 223 may generate the switching control signal SC_SIG having the disabled state after a first reference time has passed. The first reference time may be the time it takes for the memory controller 200 to perform the offset adjustment operation. In an embodiment, the control signal generator 223 may receive an offset adjustment completion response OCC_RES and then generate a switching control signal SC_SIG having a disabled state. The switching control signal SC_SIG having the disabled state may control the switch 240 to disconnect the first and second pads 241A and 241B from each other.

FIG. 7A is a diagram illustrating an operation of the command decoder 140 included in the memory device 100 in accordance with an embodiment of the present disclosure. FIG. 7B is a block diagram illustrating the offset controller 150 included in the memory device 100 in accordance with an embodiment of the present disclosure. Hereinafter, the operation of the command decoder 140 and the offset controller 150 after an offset adjustment command has been received will be described with reference to FIGS. 7A and 7B.

Referring to FIG. 7A, the command decoder 140 may receive an offset adjustment command OC_CMD from the memory controller 200. The offset adjustment command OC_CMD may be a command for instructing to store a DC component offset of a signal to be received to the memory device 100. In detail, the offset adjustment command OC_CMD may be output through the second pad 241B of the memory controller 200 and input to the fourth pad 151B of the memory device 100.

The command decoder 140 may receive a detection completion signal DF_SIG. The detection completion signal DF_SIG may indicate that the offset detection operation started in response to the offset adjustment command OC_CMD has been completed. In an embodiment, the detection completion signal DF_SIG may be received from the first converter 311 of the offset controller.

The command decoder 140 may decode the offset adjustment command OC_CMD and generate a decoding signal DEC_SIG. The command decoder 140 may generate the decoding signal DEC_SIG based on the detection completion signal DF_SIG. The decoding signal DEC_SIG may include an offset detection signal OFD_SIG and an offset compensation signal OFC_SIG.

In an embodiment, if the offset adjustment command OC_CMD is input to the command decoder 140, the command decoder 140 may generate a signal to store an offset included in an input signal. In detail, in response to the offset adjustment command OC_CMD, the command decoder 140 may generate an offset detection signal OFD_SIG having an enabled state. The command decoder 140 may generate an offset compensation signal OFC_SIG having a disabled state. The offset detection signal OFD_SIG having the enabled state and the offset compensation signal OFC_SIG having the disabled state may be output to the offset controller 150.

In an embodiment, if the detection completion signal DF_SIG is received, the command decoder 140 may generate a signal to apply the stored offset to the input terminal. In detail, in response to the detection adjustment command DF_SIG, the command decoder 140 may generate an offset detection signal OFD_SIG having a disabled state. The command decoder 140 may generate an offset compensation signal OFC_SIG having an enabled state. The offset detection signal OFD_SIG having the disabled state and the offset compensation signal OFC_SIG having the enabled state may be output to the offset controller 150.

In an embodiment, the offset detection signal OFD_SIG may control connection between the signal receiver and the first converter 311. The signal receiver may refer to the fifth amplifier AMP5. The offset compensation signal OFC_SIG may control connection between the second converter 315 and the signal receiver AMP5.

Referring to FIG. 7B, the offset controller 150 may include third and fourth pads 151A and 151B, fifth and sixth amplifiers AMP5 and AMP6, and a feedback circuit. The feedback circuit may include seventh and eighth amplifiers AMP7 and AMP8, fourth, fifth, and sixth switches SW4, SW5, and SW6, a first converter 311, a second converter 315, and a register 313. The feedback circuit may control an offset of an input signal to remove the offset. For this operation, the feedback circuit may include a DC component removal circuit. The first reference voltage signal VREFQ_A may be input through the third pad 151A, and the second reference voltage signal VREFQ_B may be input through the fourth pad 151B. An offset of the third and fourth pads 151A and 151B of the memory device 100 may be a value corresponding to a difference between the first reference voltage signal VREFQ_A and the second reference voltage signal VREFQ_B.

Referring to FIG. 7B, in terms of detection and compensation of an offset, the offset controller 150 may include the third and fourth pads 151A and 151B, a signal receiver, a signal output circuit, an offset detection path, a register 313, and an offset compensation path. The signal receiver may be the fifth amplifier AMP5. The signal output circuit may be the sixth amplifier AMP6. The offset detection path may include the seventh amplifier AMP7 and the fourth and fifth switches SW4 and SW5, and the first converter 311. The offset detection path may be coupled between the signal receiver AMP5 and the register 313. The offset compensation path may include the second converter 315, the sixth switch SW6 and the eighth amplifier AMP8. The offset compensation path may be coupled between the register 315 and the signal receiver AMP5. An offset of an input signal at an output terminal of the signal receiver AMP5 may be stored in the register 313 in the form of a digital code through the offset detection path. The digital code stored in the register 313 may be converted to an analog-type offset and transmitted to the output terminal of the signal receiver AMP5 through the offset compensation path.

The fourth and fifth switches SW4 and SW5 may control connection between the signal receiver AMP5 and the first converter 311. The sixth switch SW6 may control connection of the second converter 315 and the signal receiver AMP5. That is, the fourth and fifth switches SW4 and SW5 may control the electrical connection of the offset detection path between the signal receiver AMP5 and the register 313 and the sixth switch SW6 may control the electrical connection of the offset compensation path between the register 315 and the signal receiver AMP5.

The offset controller 150 may detect and store a DC component offset included in an input signal based on an offset detection signal OFD_SIG, and compensate for the offset included in the input signal based on the offset compensation signal OFC_SIG. In more detail, the offset controller 150 may detect and store an offset corresponding to a difference between the first and second reference voltage signals VREFQ_A and VREFQ_B that are respectively input to the third and fourth pads 151A and 151B.

Until the offset adjustment command OC_CMD is received, the offset controller 150 may perform a compensation operation based on an offset detected through a previous offset compensation operation. In this case, the register 313 may store the previous offset detected through the previous offset adjustment operation until the offset adjustment command OC_CMD is received. The previous offset stored in the register 313 may be transmitted to the second converter 315 in the form of a code. The second converter 315 may convert the previously-received offset code to an analog type signal and transmit the analog signal to the eighth amplifier AMP8. The signal converted to the analog type signal may be transmitted to the input terminal of the seventh amplifier AMP7. Through the foregoing process, the offset detected by the previous offset adjustment operation may be applied to the input terminal of the seventh amplifier AMP7, whereby the offset compensation may be implemented. However, as time goes on, the offset of the input terminal may be changed. If the previously detected offset is compensated for despite a change in offset, noise may be applied to the input signal. Therefore, in this case, the changed offset may be detected through the offset adjustment operation and stored in the register 313.

The offset controller 150 may receive the offset adjustment command OC_CMD and perform an operation of detecting and storing a currently detected offset. In detail, generated by the command decoder 140, an offset detection signal OFD_SIG having an enabled state may be provided to the fourth and fifth switches SW4 and SW5 included in the feedback circuit. Furthermore, generated by the command decoder 140, an offset compensation signal OFC_SIG having a disabled state may be provided to the sixth switch SW6.

The fourth and fifth switches SW4 and SW5 may receive an offset detection signal OFD_SIG having an enabled state and connect the signal receiver AMP5 and the first converter 311 to each other. The sixth switch SW6 may receive an offset compensation signal OFC_SIG having a disabled state and disconnect the second converter 315 and the signal receiver AMP5 from each other. If the fourth and fifth switches SW4 and SW5 connect the signal receiver AMP5 and the first converter 311 and the sixth switch SW6 disconnects the second converter 315 and the signal receiver AMP5 from each other, preparation to store an offset of an input signal may be completed.

The signal receiver AMP5 may receive a signal input through the third and fourth pads 151A and 151B. In detail, the reference voltage signal VREFQ may be provided to the input terminal of the fifth amplifier AMP5 through the third and fourth pads 151A and 151B. In other words, when the offset adjustment command OC_CMD is output from the memory controller 200, the first and second pads 241A and 241B in the memory controller 200 are connected to each other, and the output signal determiner 210 interrupts the generation of a command. Therefore, the reference voltage signal VREFQ may be input to the third and fourth pads 151A and 151B. Hence, in this case, a signal provided through the third and fourth pads 151A and 151B may be the reference voltage signal VREFQ.

A DC component offset may be included in the reference voltage signal VREFQ input to the both terminals of the fifth amplifier AMP5. The DC component offset may be changed depending on input/output terminals of an amplifier. In other words, the magnitude of the offset included in the amplified signal may be changed depending on whether the input/output terminal is an inverting terminal (−) or a non-inverting terminal (+).

The reference voltage signal VREFQ input to the both terminals of the fifth amplifier AMP5 may be amplified and then output to the seventh amplifier AMP7. The signal obtained by amplifying the reference voltage signal VREFQ may include a signal in which the DC component offset has been amplified. The signal input through the input terminal of the seventh amplifier AMP7 may be amplified again. The amplified signal may be provided to the first converter 311 through the fourth and fifth switches SW4 and SW5.

The first converter 311 may convert the signal input through the third and fourth pads 151A and 151B to a digital code. In detail, the first converter 311 may convert the DC component offset included in the amplified signal to a digital code and store it in the register 313. In other words, the first converter 311 may convert an analog signal including the offset to a digital code and store it in the register 313.

The first converter 311 may output a detection completion signal DF_SIG immediately after converting the offset to the digital code and storing the offset in the register 313. The detection completion signal DF_SIG may be transmitted to the command decoder 140. The command decoder 140 may generate an offset detection signal OFD_SIG having a disabled state and an offset compensation signal OFC_SIG having an enabled state, in response to the detection completion signal DF_SIG. Hence, the offset controller 150 may be converted from an offset detection mode to an offset compensation mode.

In an embodiment, the first converter 311 may output an offset adjustment completion response OCC_RES along with the output of the detection completion signal DF_SIG. In an embodiment, the first converter 311 may output an offset adjustment completion response OCC_RES after having output the detection completion signal DF_SIG. The offset adjustment completion response OCC_RES may be transmitted to the control signal generator 223 of the memory controller 200. As described with reference to FIG. 4, if the offset controller 150 is converted from the offset detection mode to the offset compensation mode, the offset controller 150 may output an offset adjustment completion response OCC_RES. The control signal generator 223 of the memory controller 200 may receive the offset adjustment completion response OCC_RES and generate signals for controlling the memory controller 200 to output a command to the memory device 100.

The second converter 315 may convert the digital code stored in the register 313 to an analog signal. In other words, if the signal converted to the digital code is stored in the register 313, the offset controller 150 may perform an operation of compensating for the offset included in the signal input to the third and fourth pads 151A and 151B.

Figure 8:
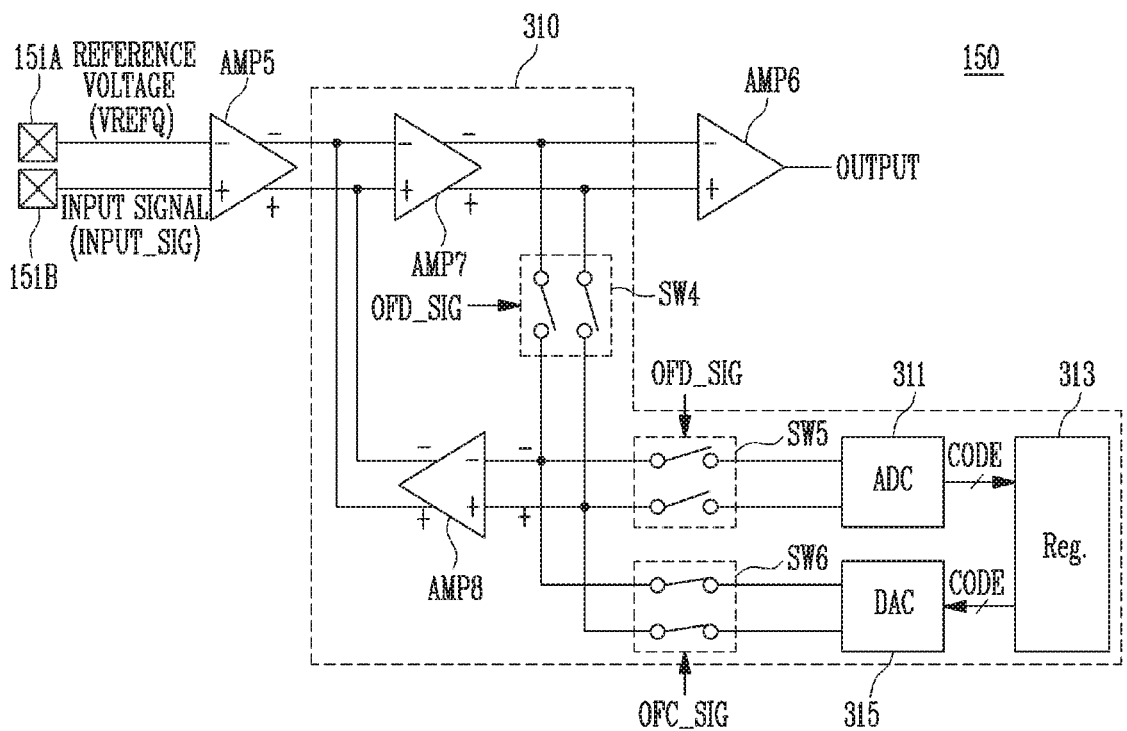
FIG. 8 is a diagram illustrating a method of compensating for an offset of an input signal after the offset has been stored, in accordance with an embodiment.

FIG. 8 is a diagram illustrating a method of compensating for an offset of an input signal after that offset has been stored, in accordance with an embodiment.

Referring to FIGS. 7B and 8, the configuration of the offset controller 150 illustrated in FIG. 8 is the same as that of the offset controller 150 illustrated in FIG. 7B. Therefore, explanation of the components described with reference to FIG. 7B are omitted here.

FIG. 8 illustrates an operation after a signal input through the third and fourth pads 151A and 151B has been converted to a digital code and then stored in the register 313. As described above, the first converter 311 may output a detection completion signal DF_SIG immediately after converting the offset to the digital code and storing the offset in the register 313. In this case, the command decoder 140 may generate an offset detection signal OFD_SIG having a disabled state and an offset compensation signal OFC_SIG having an enabled state, in response to the detection completion signal DF_SIG. Hence, the offset controller 150 may be converted from the offset detection mode to the offset compensation mode.

Immediately after the detection completion signal DF_SIG is received, or at a time at which a second reference time has passed after the offset controller 150 has been converted from the offset compensation mode to the offset detection mode, the command decoder 140 may generate an offset detection signal OFD_SIG having a disabled state and an offset compensation signal OFC_SIG having an enabled state. The second reference time may be a set time. The second reference time may be shorter than the first reference time that is the time allocated for the offset compensation. As described above, the control signal generator 223 may generate the switching control signal SC_SIG having the disabled state when the first reference time has passed after the switching control signal SC_SIG assumes the enabled state. While the switching control signal SC_SIG has the enabled state, the switch 240 may connect the first and second pads 241A and 241B to each other. While the switching control signal SC_SIG has the disabled state, the switch 240 may disconnect the first and second pads 241A and 241B from each other.

In an embodiment, an offset detection signal OFD_SIG having a disabled state may be a signal to disconnect the signal receiver AMP5 and the first converter 311 from each other. Furthermore, an offset compensation signal OFC_SIG having an enabled state may be a signal to connect the second converter 315 and the signal receiver AMP5 to each other.

The fourth and fifth switches SW4 and SW5 may receive an offset detection signal OFD_SIG having a disabled state and disconnect the signal receiver AMP5 and the first converter 311 from each other. The sixth switch SW6 may receive an offset compensation signal OFC_SIG having an enabled state and connect the second converter 315 and the signal receiver AMP5 to each other. If the fourth and fifth switches SW4 and SW5 disconnect the signal receiver AMP5 and the first converter 311 from each other and the sixth switch SW6 connects the second converter 315 and the signal receiver AMP5 to each other, preparation to compensate for the offset of the input signal INPUT_SIG may be completed.

The second converter 315 may convert the digital code stored in the register 313 to an analog signal. In other words, the digital code stored in the register 313 is converted to an analog signal, and the offset controller 150 may perform an operation of compensating for the offset included in the input signals VREFQ and INPUT_SIG input through the third and fourth pads 151A and 151B.

In detail, the digital code stored in the register 313 may be converted to an analog signal through the second converter 315. The converted analog signal may be output to an input terminal of the seventh amplifier AMP7. In an embodiment, an analog signal that is obtained by converting a digital code for an offset included in a signal output through the inverting output terminal (−) of the seventh amplifier AMP7 among the signals amplified by the fifth and seventh amplifiers AMP5 and AMP7 in the offset detection mode may be output to the non-inverting input terminal (+) of the seventh amplifier AMP7 through the eighth amplifier AMP8 in the offset compensation mode. An analog signal that is obtained by converting a digital code for an offset included in a signal output through the non-inverting output terminal (+) of the seventh amplifier AMP7 among the signals amplified by the fifth and seventh amplifiers AMP5 and AMP7 in the offset detection mode may be output to the inverting input terminal (−) of the seventh amplifier AMP7 through the eighth amplifier AMP8 in the offset compensation mode. The eighth amplifier AMP8 may amplify a converted analog signal in the offset compensation mode.

If digital codes stored in the register 313 are converted to analog signals and then output to the input terminals of the seventh amplifier AMP7, an offset of the signals VREFQ and INPUT_SIG amplified by the fifth amplifier AMP5 may be compensated due to the converted analog signal. The seventh amplifier AMP7 may amplify the signals VREFQ and INPUT_SIG of which the offset is compensated for. The sixth amplifier AMP6 may receive the signals VREFQ and INPUT_SIG amplified by the seventh amplifier AMP7 and generate an output signal OUTPUT.

Figure 9:
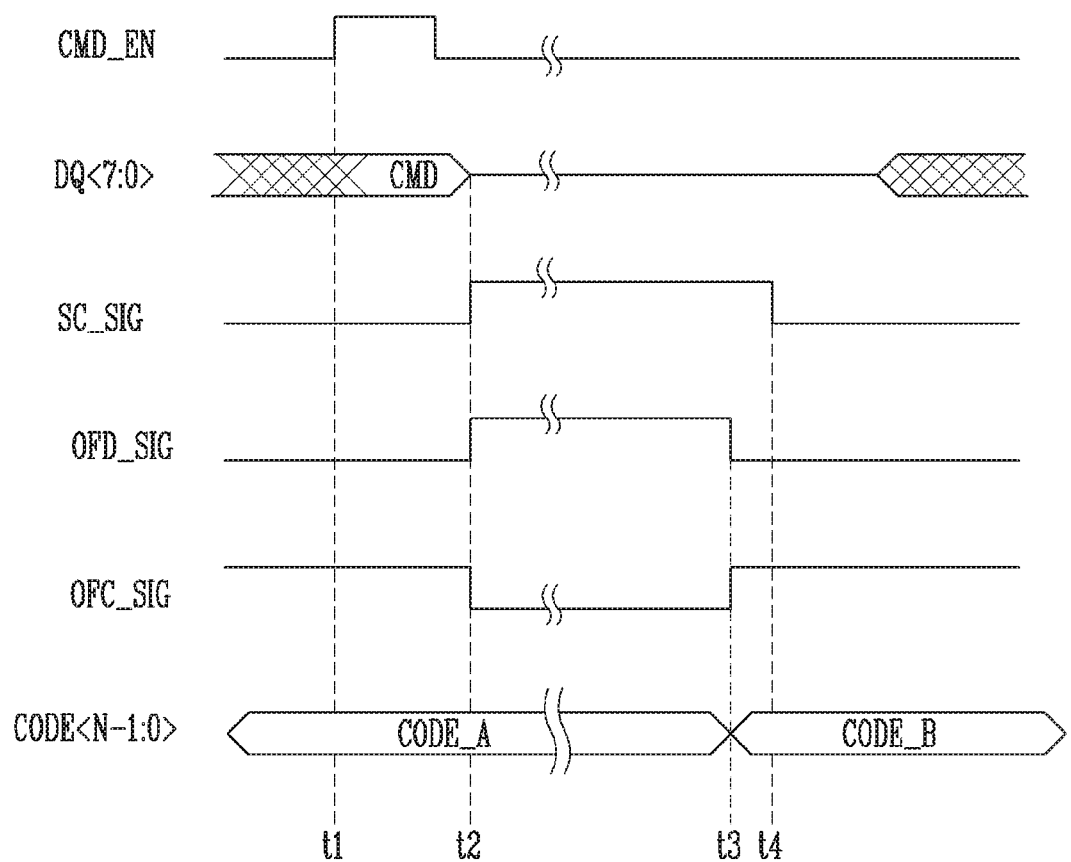
FIG. 9 is a diagram illustrating signals generated from the memory controller and the memory device of FIG. 1.

FIG. 9 is a diagram illustrating signals generated from the memory controller 200 and the memory device 100 of FIG. 1.

FIG. 9 illustrates the command enable signal CMD_EN, the input signal DQ<7:0> which is input to the memory device 100 through the third and fourth pads 151A and 151B, the switching control signal SC_SIG, the offset detection signal OFD_SIG, the offset compensation signal OFC_SIG, and the digital code CODE<N−1:0> which is stored in the register 313. In an embodiment of FIG. 9, the digital code CODE<N−1:0> may be formed of N bits. The third and fourth pads 151A and 151B may correspond to some of a plurality of pads which receive the input signal DQ<7:0>. Referring to FIG. 9, before time t1, an offset compensation operation may be performed on the input signal DQ<7:0> based on a previous digital code CODE_A.

In an embodiment, the command enable signal CMD_EN may be generated by the enable signal generator 221 included in the memory controller 200. The switching control signal SC_SIG may be generated by the control signal generator 223 included in the memory controller 200. The offset detection signal OFD_SIG and the offset compensation signal OFC_SIG may be generated by the command decoder 140 included in the memory device 100.

The command enable signal CMD_EN may be a signal for controlling the output signal determiner 210 to output the offset adjustment command OC_CMD. Therefore, the output signal determiner 210 may output the offset adjustment command OC_CMD to the memory device 100 when the command enable signal CMD_EN is in an enabled state (high level state). Each time the offset adjustment command OC_CMD is output the command enable signal CMD_EN may be in the enabled state (high level state). After the offset adjustment command OC_CMD is output, the command enable signal CMD_EN may be in a disabled state (low level state).

During a period from t1 to t2, the command enable signal CMD_EN having an enabled state (high level state) is generated, the offset adjustment command OC_CMD may be provided to the memory device 100 through the second pad 241B and the fourth pad 151B.

In other words, before time t2, the offset controller 150 of the memory device 100 may be operated in the offset compensation mode. Furthermore, after time t2, the offset controller 150 of the memory device 100 may be operated in the offset detection mode.

Various signals may be input through the input/output pad included in the memory device 100. For example, a command, an address, and data may be input through the fourth pad 151B. The offset adjustment command OC_CMD may be input through the second pad 241B and the fourth pad 151B. A signal which is input to the memory device 100 through the first pad 241A and the third pad 151A when the offset adjustment command OC_CMD is input to the memory device 100 through the second pad 241B and the fourth pad 151B may be the reference voltage signal VREFQ. If the operation of compensating an offset is completed, various signals may be input to the input/output pad of the memory device 100.

After the offset adjustment command OC_CMD has been input to the memory device 100, the switching control signal SC_SIG having an enabled state may be generated in the offset detection mode. In an embodiment, in response to a transition of the command enable signal CMD_EN from the enabled state to the disabled state, the switching control signal SC_SIG may make a transition from the disabled state to the enabled state.

The switching control signal SC_SIG having the enabled state may control the switch 240 to connect the first and second pads 241A and 241B to each other. The command enable signal CMD_EN having the disabled state may control the output signal determiner 210 to interrupt the output of a command. In other words, the output signal determiner 210 may receive the command enable signal CMD_EN having the disabled state and interrupt the output of a command so that the command may not be provided to the second pad 241B.

The switching control signal SC_SIG having the enabled state may be changed to a disabled state after the first reference time has passed. The first reference time may be the time allocated for offset adjustment.

In FIG. 9, after time t4, the switching control signal SC_SIG having the disabled state is generated and output to the switch 240. The switching control signal SC_SIG having the disabled state may control the switch 240 to disconnect the first and second pads 241A and 241B from each other.

If during the period from t1 to t2 the offset adjustment command OC_CMD is input to the command decoder 140, the offset detection signal OFD_SIG having an enabled state and the offset compensation signal OFC_SIG having a disabled state may be generated. Hence, after time t2, the offset controller 150 may be operated in the offset detection mode.

In the offset detection mode, the offset detection signal OFD_SIG having the enabled state may control the fourth and fifth switches SW4 and SW5 within the offset controller 150 to connect the signal receiver AMP5 and the first converter 311 to each other.

The offset compensation signal OFC_SIG having the disabled state may control the sixth switch SW6 within the offset controller 150 to disconnect the second converter 315 and the signal receiver AMP5 from each other.

In an embodiment, the offset detection signal OFD_SIG and the offset compensation signal OFC_SIG may have states opposite to each other. In other words, the offset detection signal OFD_SIG is in an enabled state, the offset compensation signal OFC_SIG may be in a disabled state. In contrast, if the offset detection signal OFD_SIG is in a disabled state, the offset compensation signal OFC_SIG may be in an enabled state.

After the offset is detected in the offset detection mode is stored in the register 313, the first converter 311 may transmit the detection completion signal DF_SIG to the command decoder 140. Thereby, the command decoder 140 may output the offset detection signal OFD_SIG having a disabled state and the offset compensation signal OFC_SIG having an enabled state. Hence, the offset controller 150 may be operated in the offset compensation mode.

Referring to FIG. 9, at time t3, the digital code CODE<N−1:0> stored in the register 313 may be changed from the previous digital code CODE_A to a new digital code CODE_B. The new digital code CODE_B may be a code corresponding to an offset currently detected during a period from t2 to t3. If the new digital code CODE_B is stored in the register 313, the mode of the offset controller 150 may be changed from the offset detection mode to the offset compensation mode at time t3.

In an embodiment, the offset detection signal OFD_SIG having the enabled state and the offset compensation signal OFC_SIG having the disabled state may be respectively changed to a disabled state and an enabled state after the second reference time has passed. The second reference time may be the time corresponding to the period from t2 to t3. The second reference time may be less than the first reference time. The first reference time may be the time allocated to the memory controller 200 for offset compensation. The first reference time may be the time corresponding to a period from t2 to t4.

After time t3, an offset compensation operation may be performed based on the new digital code CODE_B.

Figure 10:
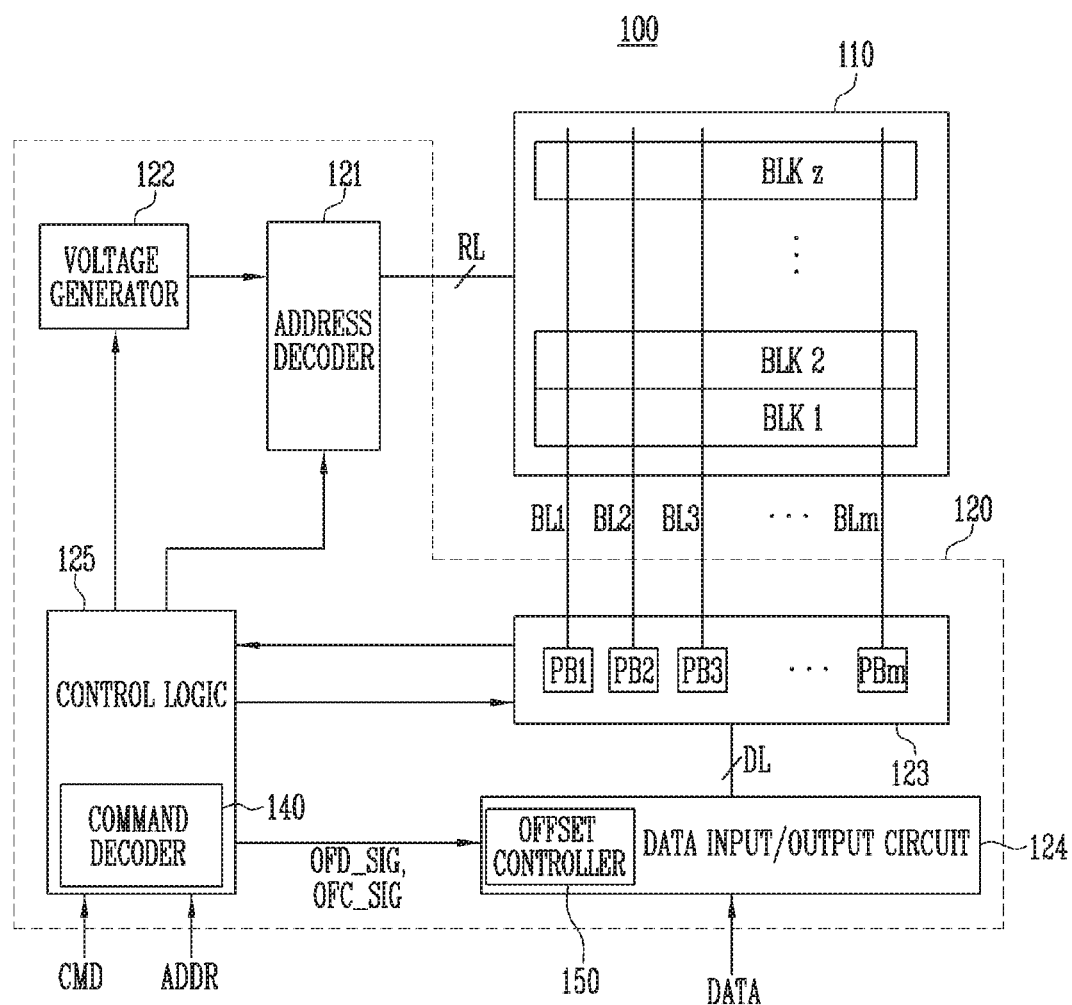
FIG. 10 is a block diagram illustrating a configuration of the memory device of FIG. 1.

FIG. 10 is a block diagram illustrating the configuration of the memory device 100 of FIG. 1.

Referring to FIG. 10, the memory device 100 may include a memory cell array 110, a peripheral circuit 120, and control logic 125.

The memory cell array 110 may include a plurality of memory blocks BLK1 to BLKz. The memory blocks BLK1 to BLKz are connected to an address decoder 121 through row lines RL and connected to a read/write circuit 123 through bit lines BL1 to BLm. Each of the memory blocks BLK1 to BLKz may include a plurality of memory cells. In an embodiment, the plurality of memory cells may be nonvolatile memory cells.

The memory cells in the memory cell array 110 may be distributed into a plurality of blocks according to the purpose of use. System information to control the memory device 100 may be stored in the plurality of blocks.

Each of the first to z-th memory blocks BLK1 to BLKz includes a plurality of memory cell strings. First to m-th cell strings are respectively coupled to the first to m-th bit lines BL1 to BLm. Each of the first to m-th cell strings includes a drain select transistor, a plurality of memory cells coupled in series to each other, and a source select transistor. The drain select transistor DST is coupled to a drain select line DSL. First to n-th memory cells are respectively coupled to first to n-th word lines. The source select transistor SST is coupled to a source select line SSL. A drain of the drain select transistor DST is coupled to the corresponding bit line. The drain select transistors DST of the first to m-th cell strings are respectively coupled to the first to m-th bit lines BL1 to BLm. A source of the source select transistor SST is coupled to a common source line CSL. In an embodiment, the common source line CSL may be coupled in common to the first to z-th memory blocks BLK1 to BLKz. The drain select line DSL, the first to n-th word lines WL1 to WLn, and the source select line SSL are included in the row lines RL. The drain select line DSL, the first to n-th word lines WL1 to WLn, and the source select line SSL are controlled by the address decoder 121. The common source line CSL is controlled by the control logic 125. The first to m-th bit lines BL1 to BLm are controlled by the read/write circuit 123.

The peripheral circuit 120 may include the address decoder 121, a voltage generator 122, the read/write circuit 123, a data input/output circuit 124, and the control logic 125.

The address decoder 121 is coupled to the memory cell array 110 through the row lines RL. The address decoder 121 may operate under control of the control logic 125. The address decoder 121 receives addresses ADDR through the control logic 125.

In an embodiment, a program operation and a read operation of the memory device 100 may be performed on a page basis.

During the program operation or the read operation, addresses ADDR received by the control logic 125 may include a block address and a row address. The address decoder 121 may decode a block address among the received addresses ADDR. The address decoder 121 may select a corresponding one of the memory blocks BLK1 to BLKz in response to the decoded block address.

The address decoder 121 may decode a row address among the received addresses ADDR. In response to the decoded row address, the address decoder 121 may apply voltages, provided from the voltage generator 122, to the row lines RL and select one word line of the selected memory block.

During an erase operation, the addresses ADDR may include a block address. The address decoder 121 may decode the block address and select a corresponding memory block in response to the decoded block address. The erase operation may be performed on the entirety or a portion of one memory block.

During a partial erase operation, the addresses ADDR may include block and row addresses. The address decoder 121 may select a corresponding one of the memory blocks BLK1 to BLKz in response to the decoded block address. The address decoder 121 may decode row addresses among the received addresses ADDR. In response to the decoded row addresses, the address decoder 121 may apply voltages, provided from the voltage generator 122, to the row lines RL and select at least one word line of the selected memory block.

In an embodiment, the address decoder 121 may include a block decoder, a word line decoder, and an address buffer.

The voltage generator 122 may generate a plurality of voltages using an external supply voltage supplied to the memory device 100. The voltage generator 122 may operate under control of the control logic 125.

In an embodiment, the voltage generator 122 may generate an internal supply voltage by regulating the external supply voltage. The internal supply voltage generated from the voltage generator 122 may be used as an operating voltage of the memory device 100.

In an embodiment, the voltage generator 122 may generate a plurality of voltages using the external supply voltage or the internal supply voltage. For example, the voltage generator 122 may include a plurality of pumping capacitors for receiving the internal supply voltage, and generate a plurality of voltages by selectively activating the plurality of pumping capacitors under control of the control logic 125. The generated voltages are applied to selected word lines by the address decoder 121.

During a program operation, the voltage generator 122 may generate a program pulse having a high voltage and a pass pulse lower in voltage level than the program pulse. During a read operation, the voltage generator 122 may generate a read voltage and a pass voltage higher than the read voltage. During an erase operation, the voltage generator 122 may generate an erase voltage.

The read/write circuit 123 may include first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm may operate under control of the control logic 125.

The first to m-th page buffers PB1 to PBm may perform data communication with the data input/output circuit 124. During a program operation, the first to m-th page buffers PB1 to PBm may receive data DATA to be stored through the data input/output circuit 124 and data lines DL.

During the program operation, the first to m-th page buffers PB1 to PBm may transmit the data, received through the data input/output circuit 124, to selected memory cells through the bit lines BL1 to BLm when a program pulse is applied to a selected word line. The memory cells in the selected page are programmed based on the transmitted data DATA. A memory cell coupled to a bit line to which a program enable voltage (e.g. a ground voltage) is applied may have an increased threshold voltage. The threshold voltage of a memory cell coupled to a bit line to which a program inhibit voltage (for example, a supply voltage) is applied may be retained. During a program verify operation, the first to m-th page buffers PB1 to PBm may read page data from selected memory cells through the bit lines BL1 to BLm.

During a read operation, the read/write circuit 123 may read data DATA from the memory cells in the selected page through the bit lines BL, and output the read data DATA to the data input/output circuit 124. During an erase operation, the read/write circuit 123 may float the bit lines BL.

In an embodiment, the read/write circuit 123 may include a column select circuit.

The data input/output circuit 124 is coupled to the first to m-th page buffers PB1 to PBm through the data lines DL. The data input/output circuit 124 may operate under control of the control logic 125. During a program operation, the data input/output circuit 124 may receive data DATA to be stored from an external controller (not illustrated).

The control logic 125 is connected to the address decoder 121, the voltage generator 122, the read/write circuit 123, and the data input/output circuit 124. The control logic 125 may control overall operations of the memory device 100. The control logic 125 may receive a command CMD and addresses ADDR from the external controller. The control logic 125 may control the address decoder 121, the voltage generator 122, the read/write circuit 123, and the data input/output circuit 124 in response to the command CMD.

The control logic 125 may include the command decoder 140. The command decoder 140 may decode the received command CMD. In the case where the received command CMD is the offset adjustment command OC_CMD, the command decoder CMD may output the offset detection signal OFD_SIG having an enabled state and the offset compensation signal OFC_SIG having a disabled state.

The data input/output circuit 124 may include the offset controller 150. The offset controller 150 may be operated in either the offset detection mode or the offset compensation mode depending on the offset detection signal OFD_SIG and the offset compensation signal OFC_SIG.

In detail, the offset controller 150 may be operated in the offset detection mode in response to the offset detection signal OFD_SIG having the enabled state and the offset compensation signal OFC_SIG having the disabled state. In detail, the offset controller 150 may be operated in the offset compensation mode in response to the offset detection signal OFD_SIG having the disabled state and the offset compensation signal OFC_SIG having the enabled state.

Figure 11:
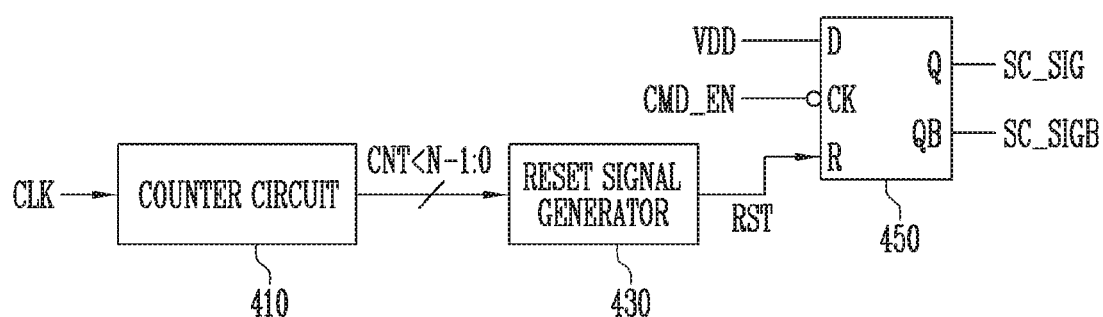
FIG. 11 is a block diagram illustrating an embodiment of the control signal generator illustrated in FIG. 4.

FIG. 11 is a block diagram illustrating an embodiment of the control signal generator 223 illustrated in FIG. 4.

Referring to FIG. 11, the control signal generator 223 may include a counter circuit, a reset signal generator 430, and a flip-flop circuit 450. The counter circuit 410 may receive a clock signal CLK and output a counting signal CNT<N−1:0>. The reset signal generator 430 may receive the counting signal CNT<N−1:0> and output a reset signal RST. The flip-flop circuit 450 may include a D terminal configured to receive a power supply voltage VDD, a CK terminal configured to receive a command enable signal CMD_EN, and an R terminal configured to receive a reset signal RST. The flip-flop circuit 450 may include a Q terminal configured to output a switching control signal SC_SIG, and a QB terminal configured to output an inverting switching control signal SC_SIGB.

When the D terminal of the flip-flop circuit 450 receives the power supply voltage VDD, the switch control signal SC_SIG may be enabled to a high level state at a falling edge of an enabled command enable signal CMD_EN. Hence, the switch 240 of the memory controller 200 may connect the first and second pads 241A and 241B to each other so that the reference voltage is transmitted to the third and fourth pads 151A and 151B of the memory device 100, as illustrated in FIG. 6.

The counter circuit 410 may count N clock (CLK) cycles. The reset signal generator 430 may generate a reset signal RST every N clock cycles. Hence, after N clock cycles, the flip-flop circuit 450 may be reset. N clock cycles may correspond to the period from t2 to t4 illustrated in FIG. 9. In other words, N clock cycles may correspond to the first reference time. The counter circuit 410 and the reset signal generator 430 may disable the switching control signal SC_SIG to a low level state after the first reference time has passed.

Figure 12:
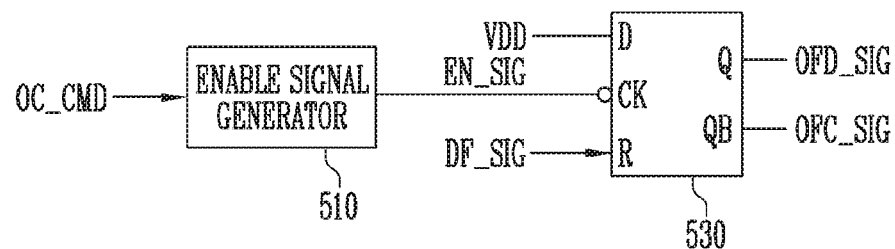
FIG. 12 is a block diagram illustrating an embodiment of the command decoder illustrated in FIG. 7A.

FIG. 12 is a block diagram illustrating an embodiment of the command decoder 430 illustrated in FIG. 7A.

Referring to FIG. 12, the command decoder 140 may include an enable signal generator 510 and a flip-flop circuit 530. The enable signal generator 510 may generate an enable signal EN_SIG which is enabled when an offset adjustment command OC_CMD is received. The flip-flop circuit 530 may include a D terminal configured to receive a power supply voltage VDD, a CK terminal configured to receive an enable signal EN_SIG, and an R terminal configured to receive a detection completion signal DF_SIG. The flip-flop circuit 530 may include a Q terminal configured to output an offset detection signal OFD_SIG, and a QB terminal configured to output an offset compensation signal OFC_SIG.

When the D terminal of the flip-flop circuit 530 receives the power supply voltage VDD, the offset detection signal OFD_SIG may be enabled to a high level state at a falling edge of the enabled enable signal EN_SIG, and the offset compensation signal OFC_SIG may be disabled to a low level state. Hence, the offset controller 150 may be operated in the offset detection mode. When the flip-flop circuit 530 receives a detection completion signal DF_SIG having an enabled state, the output thereof may be reset, whereby the offset detection signal OFD_SIG may be disabled to a low level state, and the offset compensation signal OFC_SIG may be enabled to a high level state. Consequently, the offset controller 150 may be operated in the offset compensation mode.

Figure 13:
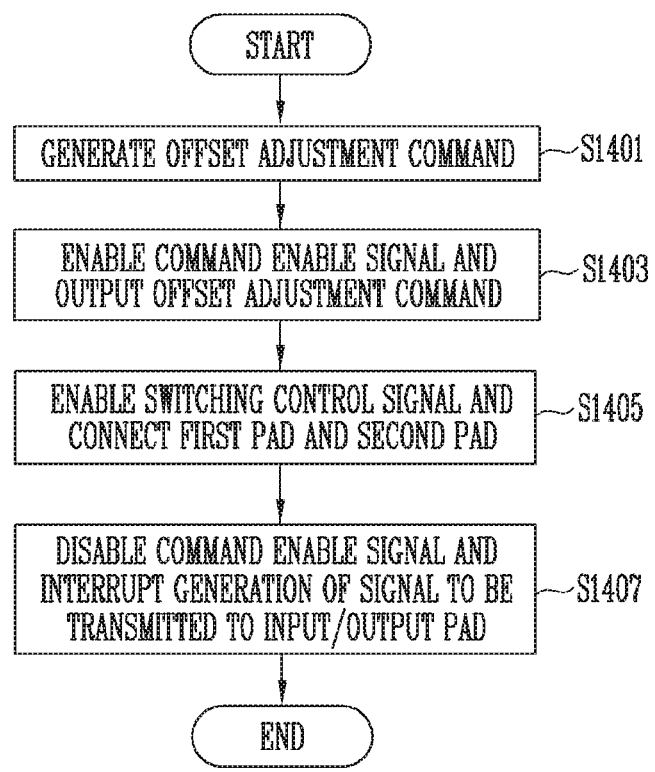
FIG. 13 is a flow chart illustrating an operation of the memory controller in accordance with an embodiment of the present disclosure.

FIG. 13 is a diagram illustrating an operation of the memory controller 200 in accordance with an embodiment of the present disclosure.

Referring to FIG. 13, at step S1401, the output signal determiner 210 may generate the offset adjustment command OC_CMD based on the operation request OPR_REQ received from the host 300 or an internal operation the memory controller 200. The generated offset adjustment command OC_CMD may be output to the switch 240.

At step S1403, the output signal determiner 210 may output the offset adjustment command OC_CMD according to the command enable signal CMD_EN. In an embodiment, the enable signal generator 221 may generate the command enable signal CMD_EN having an enabled state for controlling the output signal determiner 210 to generate the offset adjustment command OC_CMD and transmit the offset adjustment command OC_CMD to the memory device 100. The output signal determiner 210 may receive the command enable signal CMD_EN having the enabled state and then output the offset adjustment command OC_CMD.

At step S1405, the switching control signal SC_SIG may be enabled to connect the first pad 241A and the second pad 241B to each other. In detail, if the offset adjustment command OC_CMD is output to the memory device 100, the memory controller 200 may perform an operation for compensating for a DC component offset included in the input signal and storing the DC component offset. In an embodiment, to perform the operation for compensating for the DC component offset included in the input signal and storing the DC component offset, the control signal generator 223 may generate the switching control signal SC_SIG having an enabled state for controlling the switch 240. If the switching control signal SC_SIG having the enabled state is output to the switch 240, the switch 240 may connect the first and second pads 241A and 241B to each other. In detail, as illustrated in FIG. 6, the switch 240 may selectively connect the first and second nodes N1 and N2. The first node N1 is the output node of the reference voltage generator 230 and the second node N2 is the output node of the output signal determiner 210. If the switching control signal SC_SIG having the enabled state is output to the switch 240, the switch 240 may connect the first node N1 and the second node N2 to each other. While the first node N1 and the second node N2 are connected to each other, the output signal determiner 210 may output neither a command nor a signal. Therefore, the reference voltage VREFQ output from the reference voltage generator 230 may be output through the first and second pads 241A and 241B.

At step S1407, the command enable signal CMD_EN may be disabled so that the output of the signal to be transmitted to the input/output pad may be interrupted. In detail, if the offset adjustment command OC_CMD is output to the memory device 100, the memory controller 200 may perform an operation for compensating for a DC component offset included in the input signal and storing the DC component offset. In an embodiment, the enable signal generator 221 may output the command enable signal CMD_EN having a disabled state.

The command enable signal CMD_EN having the disabled state may control the output signal determiner 210 to interrupt the output of the signal to be input to the second pad 241B.

If the output signal determiner 210 receives the command enable signal CMD_EN having the disabled state, the output signal determiner 210 may interrupt the output of the signal to be input to the second pad 241B. The signal to be input to the second pad 241B may be a signal for a command, an address, and data. Therefore, although the output signal determiner 210 receives an operation request from the host 300, the output signal determiner 210 may not output a command corresponding to the operation request OPR_REQ. Alternatively, although it has been decided to perform a specific operation on the memory device 100, the output signal determiner 210 may not output a command for instructing the memory device 100 to perform the operation.

Figure 14:
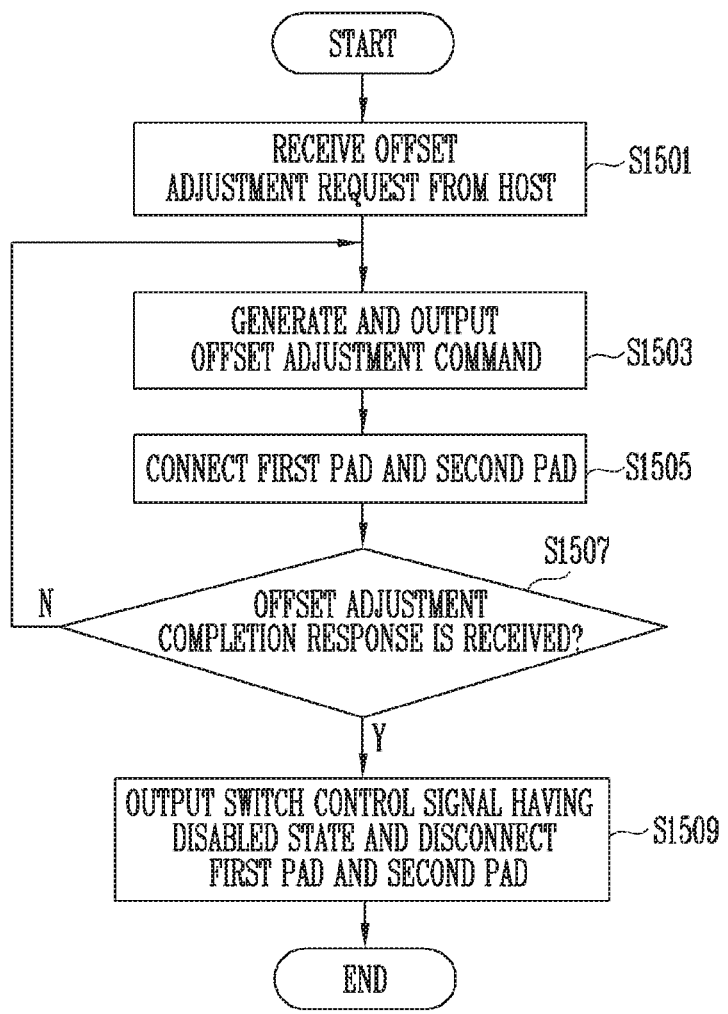
FIG. 14 is a flow chart illustrating an operation of the memory controller in accordance with an embodiment of the present disclosure.

FIG. 14 is a diagram illustrating an operation of the memory controller 200 in accordance with an embodiment of the present disclosure.

Referring to FIG. 14, at step S1501, the output signal determiner 210 may receive an offset adjustment request from the host 300. The offset adjustment request may be one of operation requests OPR_REQ received from the host 300. If the offset adjustment request is received from the host 300, the output signal determiner 210 may perform an operation of adjusting an offset of a signal input to the memory device 100.

At step S1503, the output signal determiner 210 may generate and output the offset adjustment command OC_CMD. The offset adjustment command OC_CMD may be a command for adjusting a DC component offset included in signals input to the memory device 100. In detail, the offset adjustment command OC_CMD may be a command for instructing to store or compensate a DC component offset of a signal input to the memory device 100.

In an embodiment, if the offset adjustment request is received from the host 300, the output signal determiner 210 may generate the offset adjustment command OC_CMD. The generated offset adjustment command OC_CMD may be output to memory device 100 through the second pad 241B and the fourth pad 151B.

In an embodiment, if it is decided in the memory controller 200 to adjust an offset of a signal input to the memory device 100, the output signal determiner 210 may generate and output the offset adjustment command OC_CMD regardless of a request from the host 300.

At step S1505, the first pad 241A and the second pad 241B may be connected to each other. The first and second pads 241A and 241B may be included in the memory controller 200. The first and second pads 241A and 241B each may be coupled to the memory device 100. The first and second pads 241A and 241B may be connected to each other to detect an offset of the reference voltage signal VREFQ input to the memory device 100. In detail, when the first node N1 and the second node N2 are connected to each other, the first pad 241A and the second pad 241B may be connected to each other.

If the control signal generator 223 may generate the switching control signal SC_SIG having an enabled state and output the switching control signal SC_SIG to the switch 240, the first and second pads 241A and 241B may be connected to each other.

At step S1507, it may be determined whether the control signal generator 223 has received an offset adjustment completion response OCC_RES from the memory device 100. The offset adjustment completion response OCC_RES may be output from the memory device 100 after the offset adjustment operation has been completed by the memory device 100. If the control signal generator 223 has received the offset adjustment completion response OCC_RES from the memory device 100, the process may proceed to step S1509. If the control signal generator 223 has not received the offset adjustment completion response OCC_RES from the memory device 100, the process may proceed to step S1503 so that the offset adjustment command OC_CMD for compensating the offset may be generated and output again.

At step S1509, the control signal generator 223 may output the switching control signal SC_SIG having a disabled state and thus disconnect the first pad 241A and the second pad 241B from each other. In detail, if the operation of adjusting the offset, i.e., the operation of detecting and storing the offset, has been completed in the memory device 100, the memory controller 200 may provide, through the second pad 241B and the fourth pad 151B, a command, an address, and data for controlling the memory 100. Hence, the control signal generator 223 may generate the switching control signal SC_SIG having the disabled state and output the switching control signal SC_SIG to the switch 240. If the switching control signal SC_SIG having the disabled state is output to the switch 240, the first and second pads 241A and 241B may be disconnect from each other. In more detail, the switch 240 may disconnect the first pad 241A and the second pad 241B from each other by disconnecting the first node N1 and the second node N2 from each other.

If the first and second pads 241A and 241B are disconnected from each other, a command may be input to the second pad 241B, and the input command may be output to the memory device 100. An offset of the input command may be compensated due to the digital codes stored in the register 313.

Figure 15:
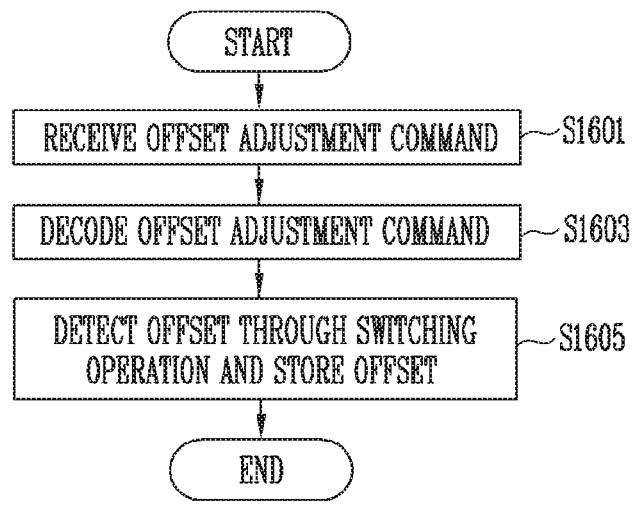
FIG. 15 is a flow chart illustrating an operation of the memory device in accordance with an embodiment of the present disclosure.

FIG. 15 is a diagram illustrating an operation of the memory device 100 in accordance with an embodiment of the present disclosure.

Referring to FIG. 15, at step S1601, the command decoder 140 may receive the offset adjustment command OC_CMD. In detail, the offset adjustment command OC_CMD may be output through the second pad 241B of the memory controller 200 and input to the fourth pad 151B of the memory device 100. If the command decoder 140 receives the offset adjustment command OC_CMD, the command decoder 140 may perform an operation of controlling the plurality of switches to detect and store an offset of the reference voltage signal VREFQ input to the memory device 100.

At step S1603, the command decoder 140 may decode the offset adjustment command OC_CMD. In detail, the command decoder 140 may decode the offset adjustment command OC_CMD and generate the decoding signal DEC_SIG. The decoding signal DEC_SIG may include the offset detection signal OFD_SIG and the offset compensation signal OFC_SIG.

In an embodiment, the offset detection signal OFD_SIG may control connection or disconnection of the fourth and fifth switches SW4 and SW5 included in the feedback circuit 310. The offset compensation signal OFC_SIG may control connection or disconnection of the sixth switch SW6 also included in the feedback circuit 310.

At step S1605, the offset controller 150 may detect and store the offset depending on a result of the decoding. In detail, to detect and store the offset, the fourth and fifth switches SW4 and SW5 may form the path from the signal receiver AMP5 to the first converter 311, and the sixth switch SW6 may disconnect the path from the second converter 315 to the signal receiver AMP5. Thereafter, the first converter 311 may convert a signal input through the third and fourth pads 151A and 151B to a digital code and store the digital code in the register 313. In other words, the first converter 311 may convert an analog signal including the offset to a digital code and store it in the register 313. As the analog signal is converted to the digital code and stored in the register 313, the offset may be detected and stored in the register 313.

Figure 16:
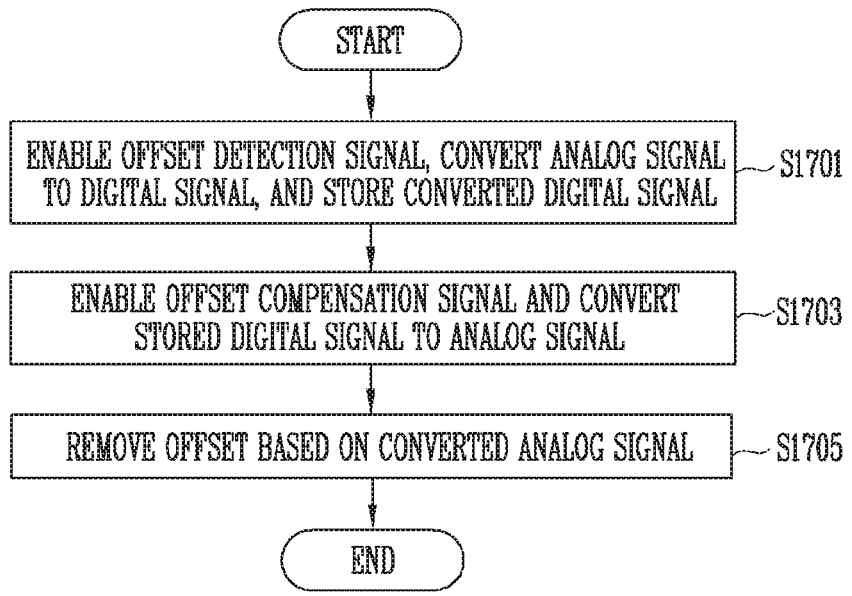
FIG. 16 is a flow chart illustrating an operation of the memory device in accordance with an embodiment of the present disclosure.

FIG. 16 is a diagram illustrating an operation of the memory device 100 in accordance with an embodiment of the present disclosure.

Referring to FIG. 16, at step S1701, the command decoder 140 may enable the offset detection signal OFD_SIG, so that the offset controller 150 may convert the analog signal to a digital signal and store the digital signal.

In an embodiment, the command decoder 140 may generate and output the offset detection signal OFD_SIG having an enabled state and an offset compensation signal OFC_SIG having a disabled state to convert the offset of the input signal to the digital signal. The fourth and fifth switches SW4 and SW5 may receive the offset detection signal OFD_SIG having the enabled state and connect the signal receiver AMP5 and the first converter 311 to each other. The sixth switch SW6 may receive the offset compensation signal OFC_SIG having the disabled state and disconnect the second converter 315 and the signal receiver AMP5 from each other. If the fourth and fifth switches SW4 and SW5 form the path from the signal receiver AMP5 to the first converter 311 and the sixth switch SW6 disconnects the path from the second converter 315 to the signal receiver AMP5, the offset of the input signal may be converted to a digital code and stored in the register 313.

At step S1703, the command decoder 140 may enable the offset compensation signal OFC_SIG, so that the offset controller 150 may convert the stored digital signal to an analog signal.

In an embodiment, the command decoder 140 may generate and output the offset compensation signal OFC_SIG having an enabled state and the offset detection signal OFD_SIG having a disabled state to convert the digital signal to the analog signal.

The fourth and fifth switches SW4 and SW5 may receive the offset detection signal OFD_SIG having the disabled state and disconnect the signal receiver AMP5 and the first converter 311 from each other. The sixth switch SW6 may receive the offset compensation signal OFC_SIG having the enabled state and connect the second converter 315 and the signal receiver AMP5 to each other. If the fourth and fifth switches SW4 and SW5 disconnect the path from the signal receiver AMP5 to the first converter 311 and the sixth switch SW6 forms the path from the second converter 315 to the signal receiver AMP5, preparation to compensate for the offset of the input signal may be completed.

At step S1705, the offset controller 150 may remove the offset based on the converted analog signal. In detail, if digital codes stored in the register 313 are converted to analog signals and then output to the input terminals of the seventh amplifier AMP7, an offset of signals amplified by the fifth amplifier AMP5 may be compensated for. The seventh amplifier AMP7 may amplify the signals of which the offset is compensated for. The sixth amplifier AMP6 may compare the signals amplified by the seventh amplifier AMP7 and output a signal generated in response to a result of the comparison.

Figure 17:
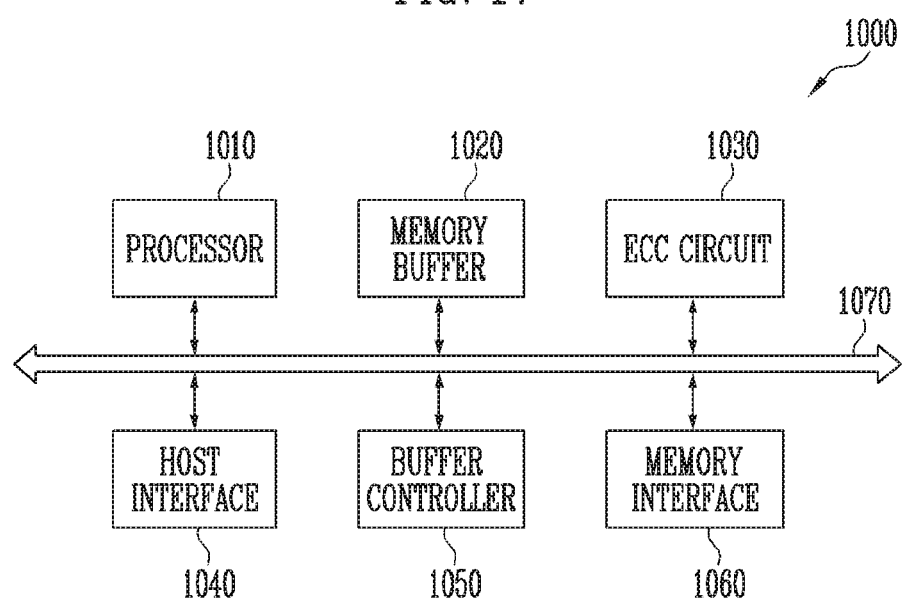
FIG. 17 is a diagram illustrating an embodiment of a memory controller of FIG. 1.

FIG. 17 is a diagram illustrating an embodiment of the memory controller of FIG. 1.

A memory controller 1000 is coupled to a host and a memory device. In response to a request from the host, the memory controller 1000 may access the memory device. For example, the memory controller 1000 may control a write operation, a read operation, an erase operation, and a background operation of the memory device. The memory controller 1000 may provide an interface between the memory device and the host. The memory controller 1000 may drive firmware for controlling the memory device.

Referring to FIG. 17, a memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may provide a channel between the components of the memory controller 1000.

The processor 1010 may control overall operation of the memory controller 1000 and perform a logical operation. The processor 1010 may communicate with the external host through the host interface 1040, and communicate with the memory device through the memory interface 1060. In addition, the processor 1010 may communicate with the memory buffer 1020 through the buffer control circuit 1050. The processor 1010 may control the operation of the memory system using the memory buffer 1020 as an operating memory, a cache memory, or a buffer memory.

The processor 1010 may perform the function of a flash translation layer (FTL). The processor 1010 may translate a logical block address (LBA), provided by the host, into a physical block address (PBA) through the FTL. The FTL may receive the LBA and translate the LBA into the PBA using a mapping table. An address mapping method using the FTL may be modified in various ways depending on the unit of mapping. Representative address mapping methods may include a page mapping method, a block mapping method, and a hybrid mapping method.

The processor 1010 may randomize data received from the host. For example, the processor 1010 may use a randomizing seed to randomize data received from the host. Randomized data may be provided to the memory device as data to be stored, and may be programmed to the memory cell array.

During a read operation, the processor 1010 may derandomize data received from the memory device 100. For example, the processor 1010 may use a derandomizing seed to derandomize data received from the memory device. Derandomized data may be output to the host.

In an embodiment, the processor 1010 may drive software or firmware to perform the randomizing operation or the derandomizing operation.

The memory buffer 1020 may be used as an operating memory, a cache memory, or a buffer memory of the processor 1010. The memory buffer 1020 may store codes and commands to be executed by the processor 1010. The memory buffer 1020 may store data to be processed by the processor 1010. The memory buffer 1020 may include a static RAM (SRAM) or a dynamic RAM (DRAM).

The ECC circuit 1030 may perform error correction. The ECC circuit 1030 may perform an ECC encoding operation based on data to be written to the memory device through the memory interface 1060. ECC encoded data may be transmitted to the memory device through the memory interface 1060. The ECC circuit 1030 may perform an ECC decoding operation on data received from the memory device through the memory interface 1060. For example, the ECC circuit 1030 may be included in, as a component of, the memory interface 1060.

The host interface 1040 may communicate with the external host under control of the processor 1010. The host interface 1040 may perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multiMedia card (MMC), an embedded MMC (eMMC), a dual in-line memory module (DIMM), a registered DIMM (RDIMM), and/or a load reduced DIMM (LRDIMM) communication methods.

The buffer control circuit 1050 may control the memory buffer 1020 under control of the processor 1010.

The memory interface 1060 may communicate with the memory device 100 under control of the processor 1010. The memory interface 1060 may communicate a command, an address, and data with the memory device through the channel.

For example, the memory controller 1000 may include neither the memory buffer 1020 nor the buffer control circuit 1050.

For example, the processor 1010 may use codes to control the operation of the memory controller 1000. The processor 1010 may load codes from a nonvolatile memory device (e.g., a read only memory) provided in the memory controller 1000. Alternatively, the processor 1010 may load codes from the memory device through the memory interface 1060.

For example, the bus 1070 of the memory controller 1000 may represent a control bus and a data bus. The data bus may transmit data in the memory controller 1000. The control bus may transmit control information such as a command and an address in the memory controller 1000. The data bus and the control bus may be disconnected from each other such that they neither interfere with nor affect each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Various embodiments of the present disclosure may provide a memory system capable of removing a direct current component offset from an input signal, and an operating method thereof.

Although embodiments of the present disclosure have been disclosed, those skilled in the art will appreciate in light of the present disclosure that various modifications, additions and substitutions are possible, without departing from the scope and spirit of the present invention.

Therefore, the scope of the present invention is defined by the appended claims including their equivalents, rather than by the description preceding them.

In the above-discussed embodiments, one or more steps may be selectively performed or skipped. In addition, the steps need not always be performed in regular, i.e., stated, order. Furthermore, the embodiments disclosed herein are intended to help those with ordinary knowledge in this art more clearly understand the present disclosure rather than aiming to limit the bounds of the present invention. In other words, one of ordinary skill in the art to which the present disclosure belongs will be able to easily understand that various modifications are possible based on the technical scope of the present disclosure.

In the foregoing description, specific terms or words used should be construed in accordance with the spirit of the present invention without limiting the subject matter thereof. It should be understood that many variations and modifications of the basic inventive concept described herein will still fall within the spirit and scope of the present invention as defined in the appended claims and their equivalents.

What is claimed is:

1. A memory system comprising:
   a memory device including an input/output pad; and
   a memory controller configured to control an operation of the memory device through the input/output pad,
   wherein the memory controller generates an offset adjustment command and transmits the offset adjustment command to the memory device,
   wherein the memory device stores an offset of a signal input thereto through the input/output pad, in response to the offset adjustment command,
   wherein the memory controller connects output nodes together after transmitting the offset adjustment command to the memory device, and
   wherein the output nodes are respectively coupled to the input/output pad.

2. The memory system according to claim 1,
   wherein the input/output pad includes a first pad and a second pad, and
   wherein the memory controller comprises:
   a reference voltage generator configured to provide a reference voltage to the first pad through a first node;

an output signal determiner configured to provide the offset adjustment command to the second pad through a second node;
a switch configured to selectively couple the first node and the second node to each other; and
a control signal generator configured to control an operation of the switch.

3. The memory system according to claim 2, wherein the memory controller further comprises an enable signal generator configured to generate a command enable signal for controlling an operation of the output signal determiner and an operation of the control signal generator.

4. The memory system according to claim 3, wherein the control signal generator controls the switch to connect the first node and the second node to each other after the output signal determiner provides the offset adjustment command to the memory device.

5. The memory system according to claim 4, wherein the control signal generator controls the switch to disconnect the first node and the second node from each other after a first reference time has passed from a time at which the first node and the second node are connected to each other.

6. The memory system according to claim 4, wherein the control signal generator controls the switch to disconnect the first node and the second node from each other based on an offset adjustment completion response received from the memory device.

7. The memory system according to claim 1,
wherein the input/output pad includes a first pad and a second pad, and
wherein the memory device comprises:
a command decoder configured to decode the offset adjustment command and generate an offset detection signal that is enabled and an offset compensation signal that is disabled; and
an offset controller configured to detect and store the offset input to the memory device through the first pad and the second pad, based on the offset detection signal that is enabled.

8. The memory system according to claim 7, wherein the offset controller comprises:
a signal receiver configured to receive a first reference voltage signal input to the memory device through the first pad and a second reference voltage signal input to the memory device through the second pad, and detect the offset between the first and second reference voltage signals;
an analog-digital converter configured to convert the offset to a digital code;
a first switch configured to control connection between the signal receiver and the analog-digital converter, based on the offset detection signal that is enabled; and
a register configured to store the digital code.

9. The memory system according to claim 8,
wherein, after the digital code is stored in the register, the analog-digital converter outputs a detection completion signal, and
wherein the command decoder outputs an offset compensation signal that is enabled and an offset detection signal that is disabled, based on the detection completion signal.

10. The memory system according to claim 9, wherein, after the detection completion signal is output, the analog-digital converter transmits, to the memory controller, an offset compensation completion response indicating that the offset controller has been converted from an offset detection mode to an offset compensation mode.

11. The memory system according to claim 10, wherein the offset controller comprises:
a digital-analog converter configured to convert the digital code stored in the register to an analog signal; and
a switch configured to control connection between the digital-analog converter and the signal receiver, based on the offset compensation signal that is enabled.

12. A memory controller configured to control an operation of a memory device, comprising:
a first and a second pads coupled to the memory device;
an output signal determiner configured to output, to the memory device, an offset adjustment command for controlling the memory device to perform an offset adjustment operation through the first and the second pads;
a switch configured to control electrical connection between a first node and a second node that are respectively coupled to the first pad and the second pad; and
a control signal generator configured to control an operation of the switch and an operation of the output signal determiner,
wherein the control signal generator controls the switch to connect the first node and the second node to each other after the output signal determiner provides the offset adjustment command to the memory device.

13. The memory controller according to claim 12,
further comprising a reference voltage generator configured to supply a reference voltage to the first pad.

14. The memory controller according to claim 13, wherein the control signal generator controls the switch to disconnect the first node and the second node from each other after a first reference time has passed from a time at which the first node and the second node are connected to each other.

15. The memory controller according to claim 13, wherein the control signal generator controls the switch to disconnect the first node and the second node from each other based on an offset adjustment completion response received from the memory device.

16. A memory device coupled to a memory controller through an input pad, the memory device comprising:
a command decoder configured to generate an offset detection signal or an offset compensation signal based on whether an offset adjustment command has been received from the memory controller; and
an offset controller configured to perform an offset detection operation of the input pad based on the offset detection signal, output an offset adjustment completion response after performing the offset detection operation and perform an offset compensation operation of the input pad based on the offset compensation signal.

17. The memory device according to claim 16,
wherein, when the offset adjustment command is not received, the command decoder generates the offset compensation signal that is enabled, and
wherein, when the offset adjustment command is received, the command decoder generates the offset detection signal that is enabled.

18. The memory device according to claim 17, wherein the offset controller comprises:
a signal receiver coupled to the input pad and configured to receive a signal from the memory controller;
an offset detection path configured to detect, based on the offset detection signal that is enabled, an offset of the signal output through an output terminal of the signal receiver and generate a digital code corresponding to the offset;

a register configured to store the digital code; and an offset compensation path configured to convert, based on the offset compensation signal that is enabled, the digital code stored in the register to an analog signal and provide the analog signal to the output terminal of the signal receiver.

19. The memory device according to claim 18, wherein the offset detection path comprises:

an amplifier configured to amplify of the signal output from the signal receiver;

a switching circuit coupled to an output terminal of the amplifier; and an analog-digital converter coupled between the switching circuit and the register, and wherein, based on the offset detection signal that is enabled, the switching circuit electrically couples the output terminal of the amplifier to the analog-digital converter.

20. The memory device according to claim 18, wherein the offset compensation path comprises:

a digital-analog converter coupled to the register;

a switching circuit coupled to an output terminal of the digital-analog converter; and an amplifier coupled between the switching circuit and the output terminal of the signal receiver, and wherein, based on the offset compensation signal that is enabled, the switching circuit electrically couples the digital-analog converter to the output terminal of the signal receiver.

* * * * *